(12) United States Patent
Dong-Hun

(10) Patent No.: US 8,591,224 B2
(45) Date of Patent: Nov. 26, 2013

(54) SUBSTRATE PROCESSING APPARATUS AND SUBSTRATE PROCESSING METHOD

(75) Inventor: Kim Dong-Hun, Yongin-si (KR)

(73) Assignee: Tokyo Electron Limited, Tokyo (JP)

( * ) Notice: Subject to any disclaimer, the term of this patent is extended or adjusted under 35 U.S.C. 154(b) by 904 days.

(21) Appl. No.: 12/659,783

(22) Filed: Mar. 22, 2010

(65) Prior Publication Data

US 2010/0183807 A1 Jul. 22, 2010

Related U.S. Application Data

(63) Continuation-in-part of application No. 11/702,543, filed on Feb. 6, 2007, now Pat. No. 7,758,341, which is a continuation of application No. 11/645,529, filed on Dec. 27, 2006.

(30) Foreign Application Priority Data

Sep. 29, 2006 (JP) .................................. 2006-267190

(51) Int. Cl.
F27B 5/14 (2006.01)

(52) U.S. Cl.
USPC ............................. 432/247; 219/390; 219/396

(58) Field of Classification Search
USPC .......... 432/239, 241, 247; 219/405, 411, 390; 118/715, 724, 725, 729
See application file for complete search history.

(56) References Cited

U.S. PATENT DOCUMENTS

| | | | |
|---|---|---|---|
| 6,370,897 B1 | 4/2002 | Suenaga et al. | |
| 6,575,737 B1* | 6/2003 | Perlov et al. | 432/81 |
| 7,241,061 B2* | 7/2007 | Akimoto et al. | 396/611 |
| 7,287,920 B2 | 10/2007 | Hayashi et al. | |
| 7,379,785 B2* | 5/2008 | Higashi et al. | 700/112 |
| 8,211,232 B2* | 7/2012 | Hayashi | 118/715 |
| 2004/0050321 A1* | 3/2004 | Kitano et al. | 118/300 |
| 2006/0201423 A1* | 9/2006 | Akimoto et al. | 118/712 |
| 2007/0056514 A1 | 3/2007 | Akimoto et al. | |
| 2007/0275178 A1* | 11/2007 | Nishi et al. | 427/430.1 |
| 2008/0011713 A1* | 1/2008 | Ito | 216/41 |
| 2010/0183807 A1* | 7/2010 | Kim | 427/248.1 |

FOREIGN PATENT DOCUMENTS

| | | |
|---|---|---|
| JP | 2001-168009 | 6/2001 |
| JP | 2001-168009 A | 6/2001 |
| KR | 10-0129664 B1 | 11/1997 |
| KR | 100129664 | 11/1997 |
| KR | 10-0234635 | 9/1999 |
| KR | 10-2002-0072199 A | 9/2002 |
| KR | 1020020072199 | 9/2002 |
| KR | 10-2004-0080825 A | 9/2004 |
| KR | 1020040080825 | 9/2004 |
| KR | 10-2004-0106045 A | 12/2004 |
| KR | 1020040106045 | 12/2004 |

(Continued)

Primary Examiner — Gregory A Wilson
(74) Attorney, Agent, or Firm — IPUSA, PLLC

(57) ABSTRACT

A substrate processing apparatus includes heat treatment apparatus blocks each comprised of stacked heat treatment apparatuses HP each having temperature adjustment mechanism 70 configured to be able to move a substrate to a heating mechanism and adjust the temperature of the substrate, and includes a cooling liquid supply mechanism 81 that supplies a cooling liquid set for a predetermined temperature to be supplied for each of the heat treatment apparatus blocks HPB, a supply mechanism 99 which branches the cooling liquid supplied from cooling liquid supply mechanism 81 and supplies the cooling liquid to each temperature adjustment mechanism 70 of heating mechanisms in one of the heat treatment apparatus blocks.

17 Claims, 25 Drawing Sheets

(56) References Cited

FOREIGN PATENT DOCUMENTS

| KR | 1020050083939 | 8/2005 |
| KR | 10-2006-0054648 A | 5/2006 |
| KR | 1020060088495 | 8/2006 |
| KR | 1020060092061 | 8/2006 |

* cited by examiner

SUBSTRATE PROCESSING APPARATUS AND SUBSTRATE PROCESSING METHOD

This application is a Continuation-in-Part of application Ser. No. 11/702,543 filed on Feb. 6, 2007, U.S. Pat. No. 7,758,341, which is a Continuation of application Ser. No. 11/645,529 Dec. 27, 2006 U.S. Pat. No. 7,503,762. The patent application relates to subject matter contained in Japanese Patent Application No. 2006-267190 filed on Sep. 29, 2006, which is expressly incorporated herein by reference in their entireties.

BACKGROUND

1. Technical Field

Example embodiments of the present invention relates to substrate processing apparatuses, and substrate processing methods using the substrate processing apparatuses.

2. Description of Related Art

In a heat treatment apparatus and the like used in a coating/development apparatus using a SOG solution and photoresist solution that manufacture and process a processing target substrate, for example, an electronic material such as a semiconductor wafer and the like, it is generally known using a heat treatment apparatus having therein both a cooling plate that cools a semiconductor wafer and a hot plate that performs heating processing on the semiconductor wafer. As an example of such technique, for example, there is Japanese Unexamined Patent Publication No. 2003-77906.

As described in Japanese Unexamined Patent Publication No. 2003-77906, the technique is to use cooling water, Peltier element and the like to control the temperature of the cooling plate of the heat treatment apparatus.

However, when a plurality of heat treatment apparatuses is used, it is required to control the apparatuses independently of each other. For example, when the Peltier element is used, it is inevitable to control independently each of the heat treatment apparatuses, and problems arise that the system as the entire apparatus is complicated, and that increases are thereby caused in size and cost in the system. Further, in each heat treatment apparatus, for example, when cooling water is used, the temperature of used cooling water is controlled independently for each heat treatment apparatus, and the problems also arise that the system as the entire apparatus is complicated, and that increases are thereby caused in size and cost in the system.

SUMMARY

In some example embodiments, a substrate processing apparatus is provided which is provided with a plurality of heat treatment apparatus blocks each comprised of a plurality of stacked heat treatment apparatuses each having a temperature adjustment mechanism configured to be able to move a processing target substrate to a heat treatment section and adjust the temperature of the processing target substrate, and has a cooling liquid supply mechanism that supplies a cooling liquid set for a predetermined temperature to be supplied for each of the heat treatment apparatus blocks, and a branch mechanism which branches the cooling liquid supplied from the cooling liquid supply mechanism and supplies the cooling liquid to each temperature adjustment mechanism of a plurality of heat treatment sections in one of the heat treatment apparatus blocks.

In other example embodiments, a substrate processing apparatus is provided which is provided with a plurality of heat treatment apparatus blocks each comprised of a plurality of stacked heat treatment apparatuses each having a temperature adjustment mechanism configured to be able to move a processing target substrate to a heat treatment section and adjust the temperature of the processing target substrate, and with a plurality of liquid processing apparatus blocks each comprised of a plurality of liquid processing apparatuses each of which supplies a predetermined liquid to the processing target substrate to perform the same processing and which is disposed in the horizontal direction or vertical direction, and has a cooling liquid supply mechanism that supplies a cooling liquid set for a predetermined temperature to be supplied for each of the heat treatment apparatus blocks, a liquid branch mechanism which branches the cooling liquid supplied from the cooling liquid supply mechanism and supplies the cooling liquid to each temperature adjustment mechanism of a plurality of heat treatment sections in one of the heat treatment apparatus blocks, a gas supply mechanism that supplies a gas set for a predetermined temperature and humidity to be supplied for each of the liquid processing apparatus blocks, and a gas branch mechanism which branches the gas supplied from the gas supply mechanism and supplies the gas to each of liquid processing apparatuses in one of the liquid processing apparatus blocks.

In still other example embodiments, a substrate processing method for a substrate processing apparatus is provided where the apparatus is provided with a plurality of heat treatment apparatus blocks each comprised of a plurality of stacked heat treatment apparatuses each having a temperature adjustment mechanism configured to be able to move a processing target substrate to a heat treatment section and adjust the temperature of the processing target substrate, and has the steps of supplying a cooling liquid set for a predetermined temperature for each of the heat treatment apparatus blocks, branching the cooling liquid and supplying the cooling liquid to each temperature adjustment mechanism of a plurality of heat treatment sections in one of the heat treatment apparatus blocks, and recovering the cooling liquid supplied for each of the heat treatment apparatus blocks, for each of the heat treatment apparatus blocks.

In still other example embodiments, a substrate processing method for a substrate processing apparatus is provided where the apparatus is provided with a plurality of heat treatment apparatus blocks each comprised of a plurality of stacked heat treatment apparatuses each having a temperature adjustment mechanism configured to be able to move a processing target substrate to a heat treatment section and adjust the temperature of the processing target substrate, and with a plurality of liquid processing apparatus blocks each comprised of a plurality of liquid processing apparatuses each of which supplies a predetermined liquid to the processing target substrate to perform the same processing and which is disposed in the horizontal direction or vertical direction, and has the steps of supplying a cooling liquid set for a predetermined temperature to be supplied for each of the heat treatment apparatus blocks, branching the supplied cooling liquid and supplying the cooling liquid to each temperature adjustment mechanism of a plurality of heat treatment sections in one of the heat treatment apparatus blocks, supplying a gas set for a predetermined temperature and humidity to be supplied for each of the liquid processing apparatus blocks, and branching the supplied gas and supplying the gas to each of liquid processing apparatuses in one of the liquid processing apparatus blocks.

In still other example embodiments, a utility supply apparatus is provided which supplies utility to a substrate processing apparatus provided with a plurality of heat treatment apparatus blocks each comprised of a plurality of stacked heat treatment apparatuses each having a temperature adjustment mechanism configured to be able to move a processing target substrate to a heat treatment section and adjust the temperature of the processing target substrate, and has a cooling liquid supply mechanism that supplies a cooling liquid set for a predetermined temperature to be supplied for each of the heat treatment apparatus blocks, and a cooling liquid recovery mechanism that collects a plurality of cooling liquids supplied from the cooling liquid supply mechanism for each of the heat treatment apparatus blocks, for each of the heat treatment apparatus blocks.

In still other example embodiments, a utility supply apparatus is provided which supplies utility to a substrate processing apparatus provided with a plurality of heat treatment apparatus blocks each comprised of a plurality of stacked heat treatment apparatuses each having a temperature adjustment mechanism configured to be able to move a processing target substrate to a heat treatment section and adjust the temperature of the processing target substrate, and has a first cooling liquid supply mechanism that supplies a cooling liquid set for a predetermined temperature to be supplied for each of the heat treatment apparatus blocks, a cooling liquid recovery mechanism that collects, for each of the heat treatment apparatus blocks, a plurality of cooling liquids supplied from the cooling liquid supply mechanism for each of the heat treatment apparatus blocks, a detecting mechanism that detects the temperature of the cooling liquid recovered by the cooling liquid recovery mechanism and/or the cooling liquid supplied by the first cooling liquid supply mechanism, and a switch mechanism that switches supply of the cooling liquid from the first cooling liquid supply mechanism to a second cooling liquid supply mechanism when the temperature of the cooling liquid of at least one cooling liquid line in each of the heat treatment apparatus blocks detected by the detecting mechanism is not in a predetermined temperature range.

In still other example embodiments, a utility supply apparatus is provided which supplies a gas set for a predetermined temperature and humidity to a substrate processing apparatus provided with a plurality of liquid processing apparatus blocks stacked or disposed in the horizontal direction where each of the blocks is comprised of a plurality of liquid processing apparatuses each of which supplies a predetermined liquid to the processing target substrate to perform the same processing and which is disposed in the horizontal direction or vertical direction, and has a plurality of exhaust mechanisms that exhausts the gas for each of the liquid processing apparatus blocks, a space portion that supplies the gas collectively to the plurality of exhaust mechanisms, a humidity adjustment mechanism that sets the gas in the space portion at a predetermined humidity, a blowing mechanism that substantially sends the gas to the space portion, a heat mechanism that is disposed substantially under the center position of a rotation mechanism of the blowing mechanism and that sets the gas at a predetermined temperature, a cooling mechanism that is disposed in a position lower than the heat mechanism and that cools the gas to a predetermined temperature, and a flowing portion that is disposed between the cooling mechanism and the heat mechanism and that is configured to enable the gas to be passed therethrough, where a width of the cooling mechanism is set to be larger than a width of the flowing portion.

In still other example embodiments, a utility supply apparatus is provided which supplies a gas set for a predetermined temperature and humidity to a substrate processing apparatus provided with a plurality of liquid processing apparatus blocks stacked or disposed in the horizontal direction where each of the blocks is comprised of a plurality of liquid processing apparatuses each of which supplies a predetermined liquid to the processing target substrate to perform the same processing and which is disposed in the horizontal direction or vertical direction, and has a plurality of exhaust mechanisms that exhausts the gas for each of the liquid processing apparatus blocks, a space portion that supplies a gas collectively to the plurality of exhaust mechanisms, a humidity adjustment mechanism that sets the gas in the space portion at a predetermined humidity, a blowing mechanism that substantially sends the gas to the space portion, a heat mechanism that is disposed substantially under the center position of a rotation mechanism of the blowing mechanism and that sets the gas at a predetermined temperature, a cooling mechanism that is disposed in a position lower than the heat mechanism and that cools the gas to a predetermined temperature, a flowing portion which is disposed between the cooling mechanism and the heat mechanism and configured to enable the gas to be passed therethrough and has a width smaller than a width of the cooling mechanism, a cooling plate that is disposed in the cooling mechanism under the flowing portion and that extends in the direction of the flowing portion, and a gas introducing mechanism that introduces a gas from the side of the cooling plate to the inside of the apparatus.

In still other example embodiments, a utility supply method for a substrate processing apparatus is provided of supplying utility to the substrate processing apparatus provided with a plurality of heat treatment apparatus blocks each comprised of a plurality of stacked heat treatment apparatuses each having a temperature adjustment mechanism configured to be able to move a processing target substrate to a heat treatment section and adjust the temperature of the processing target substrate, and has the steps of supplying a cooling liquid set for a predetermined temperature to be supplied for each of the heat treatment apparatus blocks, recovering the cooling liquid supplied for each of the heat treatment apparatus blocks, for each of the heat treatment apparatus blocks, and detecting the temperature of the cooling liquid recovered for each of the heat treatment apparatus blocks and/or the cooling liquid supplied for each of the heat treatment apparatus blocks.

In still other example embodiments, a utility supply method for a substrate processing apparatus is provided of supplying utility to the substrate processing apparatus provided with a plurality of heat treatment apparatus blocks each comprised of a plurality of stacked heat treatment apparatuses each having a temperature adjustment mechanism configured to be able to move a processing target substrate to a heat treatment section and adjust the temperature of the processing target substrate, and has the steps of supplying a cooling liquid set for a predetermined temperature to be supplied for each of the heat treatment apparatus blocks, recovering the cooling liquid supplied for each of the heat treatment apparatus blocks, for each of the heat treatment apparatus blocks, detecting the temperature of the cooling liquid recovered for each of the heat treatment apparatus blocks and/or the cooling liquid supplied for each of the heat treatment apparatus blocks, and switching from a supply line for the cooling liquid collectively to a different supply line when the temperature of the cooling liquid is not in a predetermined temperature range.

BRIEF DESCRIPTION OF THE DRAWINGS

The various features of novelty which characterize example embodiments of the invention are pointed out with particularity in the claims attached to and forming a part of this specification. For a better understanding of example embodiments of the invention, its operating advantages, and specific objects attained by its use, reference has the accompanying drawing and descriptive matter in which there is illustrated and described example embodiments of the invention.

DETAILED DESCRIPTION OF THE PREFERRED EMBODIMENTS

Figure 1:
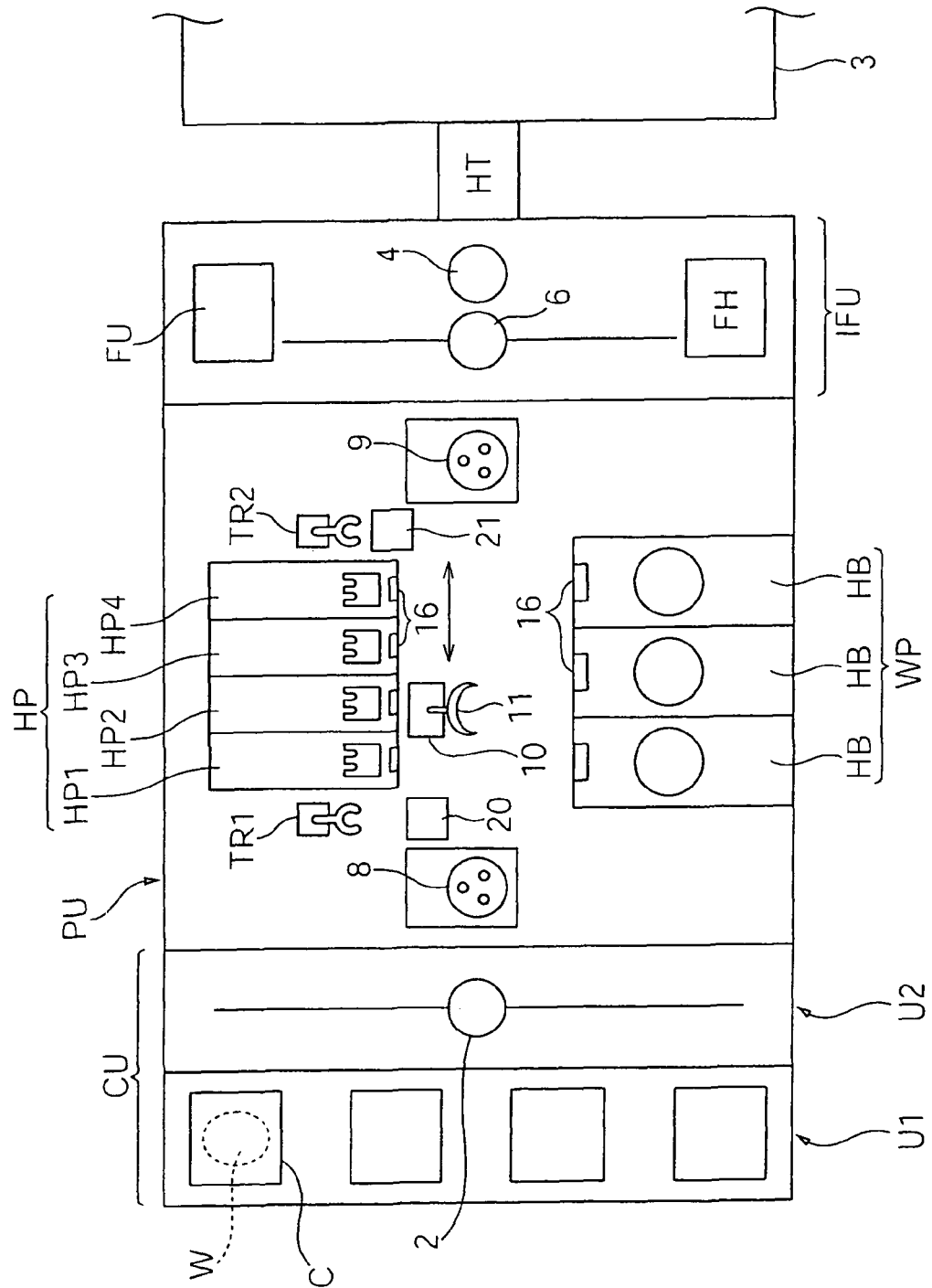
FIG. 1 is a plan view showing the entire structure in an example embodiment of a substrate processing apparatus according to the invention.

Example embodiments of the present invention will specifically be described below with reference to accompanying drawings. FIG. 1 is a schematic plan view showing an entire structure in an embodiment of a coating/development apparatus as a substrate processing apparatus, for example, as a resist processing apparatus. In case of a "unit" or a "unit section" comprised of "A" and "B", the "unit" or "unit section" means not only one structure that includes "A" and "B", but also means that "A" and "B" may be removably secured each other.

The resist processing apparatus 1 is provided at one end with a cassette unit section CU comprised of a cassette mount section U1 configured to enable a plurality of cassettes C each as a storage body capable of storing a plurality of processing target substrates, for example, semiconductor wafers W to be linearly mounted thereon, and a substrate carrying in/out mechanism section U2 in which is provided, for example, a self-propelled substrate carrying in/out mechanism 2 configured to be able to carry a semiconductor wafer W on a sheet basis to/from the cassette C of the cassette mount section U1, and at the other end with a linearly-formed interface unit section IFU comprised of a delivering/receiving section 4 that delivers and receives the semiconductor wafer W on a sheet basis to another apparatus, for example, an exposure apparatus 3 that performs exposure processing on the semiconductor wafer W via a carrying in/out passage HT, and for example, a self-propelled substrate carrying in/out mechanism 6 configured to be able to carry in/out the semiconductor wafer W on a sheet basis. The linearly-formed interface unit section IFU is further provided at one end with a cassette mount section FU configured to enable at least one cassette C as a storage body capable of storing a plurality of semiconductor wafers W to be mounted thereon, while being provided at the other end with a heating processing chamber FH that performs heating processing on the semiconductor wafer W processed in the exposure apparatus 3, and the substrate carrying in/out mechanism 6 is configured to be able to carry the semiconductor wafer W on a sheet basis to/from the heating processing chamber FH and the cassette C on the cassette mount section FU.

Figure 2:
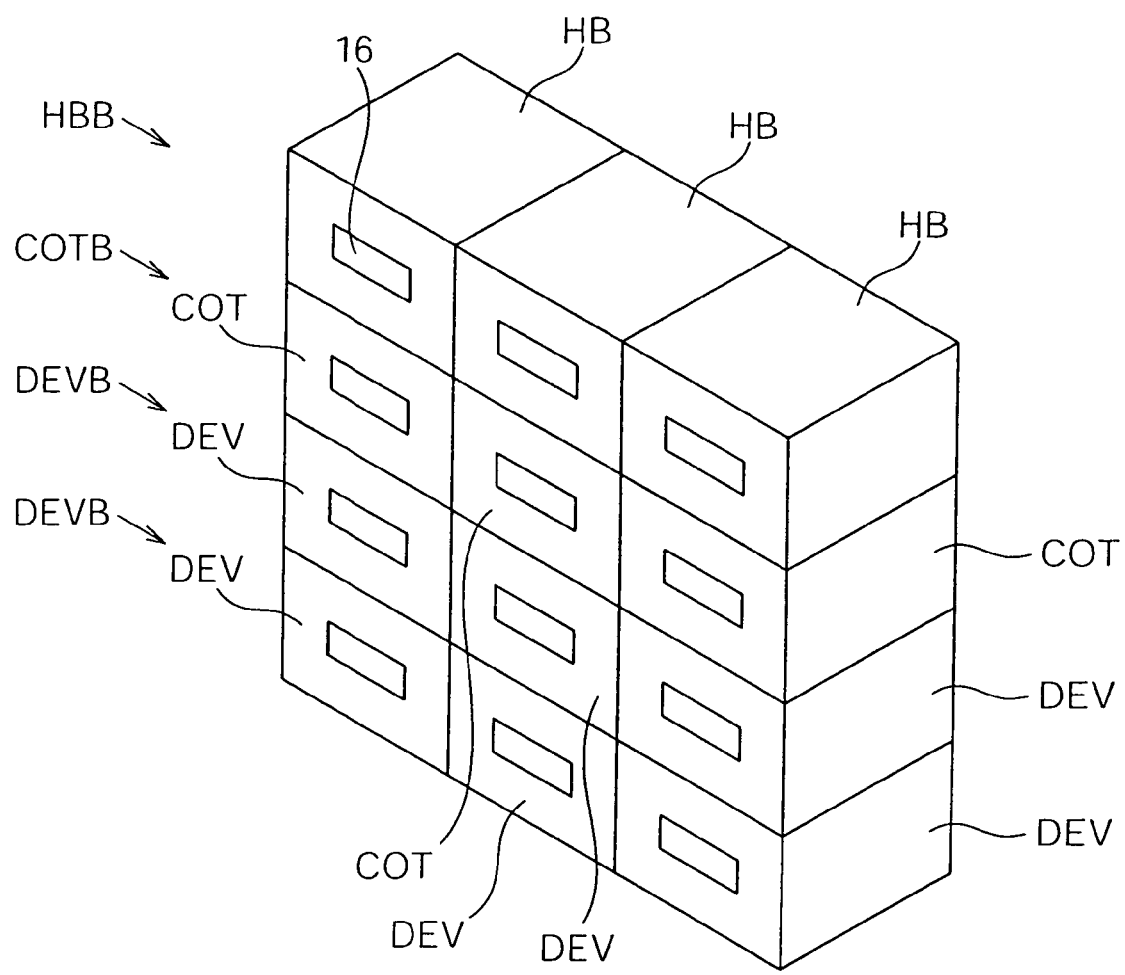
FIG. 2 is a schematic perspective view to explain principal part of a liquid processing apparatus of FIG. 1.

Further, a process unit section PU is disposed between the cassette unit section CU and interface unit section IFU of the resist processing apparatus 1. In the process unit section PU, at one side not in contact with the cassette unit section CU and the interface unit section IFU, as shown in FIG. 2, in the highest portion is configured a horizontal block, as the same type of processing, formed of processing apparatuses that perform predetermined processing on the semiconductor wafer W, for example, as liquid processing apparatuses, a plurality of, for example, three antireflective film forming apparatuses HB which are disposed in the horizontal direction and each of which supplies a predetermined processing liquid to form an antireflective film to the semiconductor wafer W prior to and/or subsequent to processing by a coater COT described later to process the semiconductor wafer W. Further, in a position lower than the antireflective film forming apparatus HB block HBB is configured a horizontal block, as the same type of processing, formed of a plurality of, for example, three coaters which are disposed in the horizontal direction and each of which applies a resist solution to the semiconductor wafer W.

Further, in a position lower than the coater COT block COTE is configured a first horizontal block, as the same type of processing, formed of a plurality of, for example, three development processing apparatuses DEV which are disposed in the horizontal direction and each of which develops an exposed resist on the semiconductor wafer W. Furthermore, in a position lower than the development processing apparatus DEV block DEVB is configured a second horizontal block, as the same type of processing, formed of a plurality of, for example, three development processing apparatuses DEV which are disposed in the horizontal direction and each of which develops an exposed resist on the semiconductor wafer W. Thus, at least one, for example, two development processing apparatus DEV blocks DEVBs, coater COT block COTB, and antireflective film forming apparatus HB block HBB are stacked, and constitute a liquid processing apparatus section.

Figure 3:
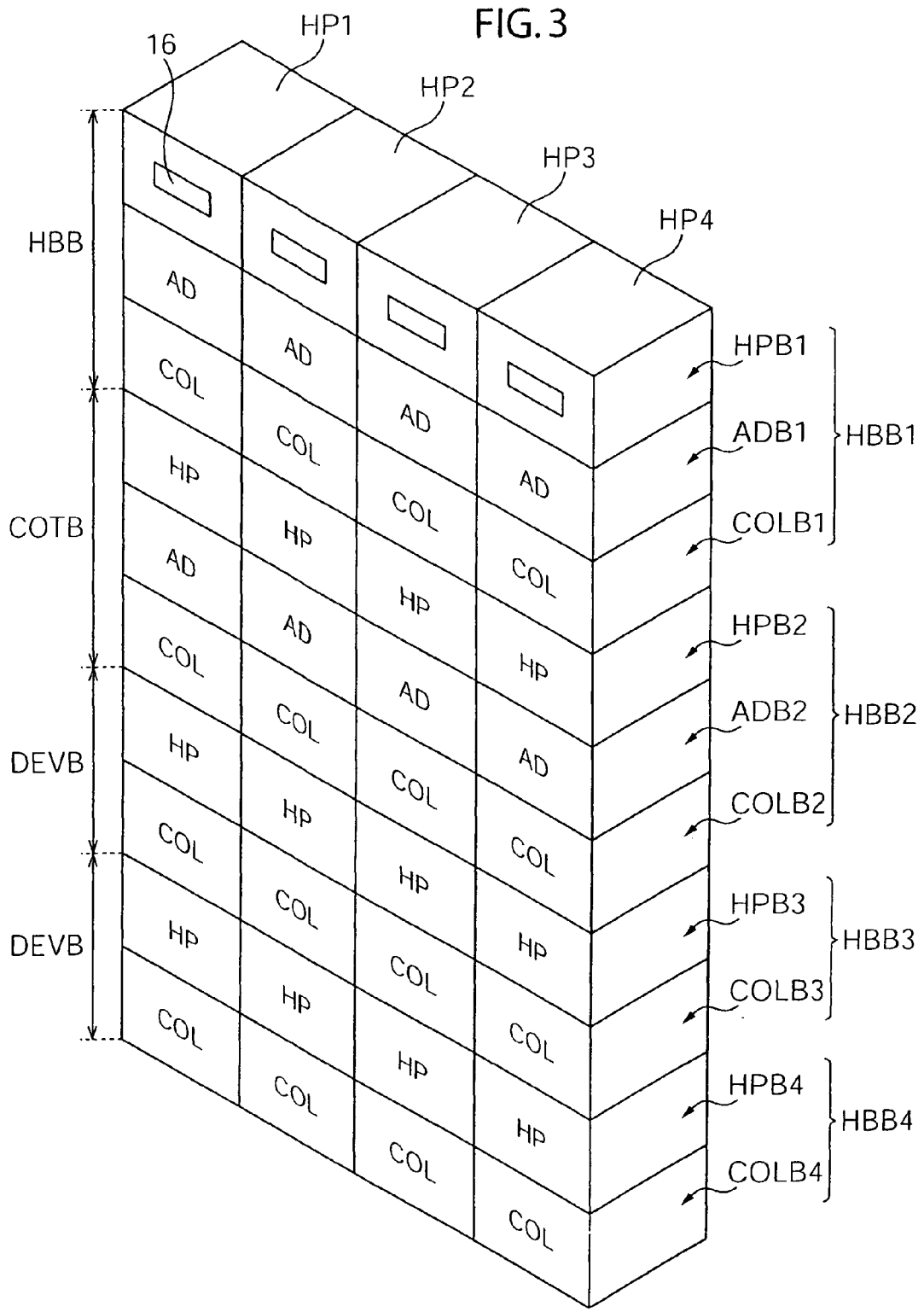
FIG. 3 is a schematic perspective view to explain principal part of a heat treatment apparatus of FIG. 1.

In the process unit section PU, at the other opposite side not in contact with the cassette unit section CU and the interface unit section IFU, as shown in FIG. 3, configured are blocks that correspond to the antireflective film forming apparatus HB block HBB as described above and that have the same vertical length as that of the antireflective film forming apparatus HB block HBB. From the above, configured is a horizontal block HPB1 formed of a plurality of, for example, four heaters HP which are disposed horizontally to form the block and each of which performs processing on the semiconductor wafer W at a predetermined temperature. Under the horizontal block HPB1 is disposed a horizontal block ADB1 formed of a plurality of, for example, four hydrophobic processing apparatuses AD which are disposed horizontally to form the block and each of which performs hydrophobic processing on the semiconductor wafer W. Under the horizontal block ADB1 is disposed a horizontal block COLB1 formed of a plurality of, for example, four temperature adjustment apparatuses COL which are disposed horizontally to form the block and each of which adjusts the temperature of the semiconductor wafer W, which is subjected to heating processing in the hydrophobic processing apparatus AD and/or heater HP, to a predetermined temperature, for example, a temperature in a range between about 21° C. and about 23° C., preferably substantially 23° C. The heaters of the region HBB1 are configured to be able to perform heating/cooling processing on the semiconductor wafers W processed in the antireflective film forming apparatuses HB of the antireflective film forming apparatus HB block HBB.

Further, under the heater group of the region HBB1, configured are blocks that correspond to the coater COT block COTB as described above and that have the same vertical length as that of the coater COT block COTB. From the above, configured is a horizontal block HPB2 formed of a plurality of, for example, four heaters HP which are disposed horizontally to form the block and each of which performs processing on the semiconductor wafer W at a predetermined temperature. Under the horizontal block HPB2 is disposed a horizontal block ADB2 formed of a plurality of, for example, four hydrophobic processing apparatuses AD which are disposed horizontally to form the block and each of which performs hydrophobic processing on the semiconductor wafer W. Under the horizontal block ADB2 is disposed a horizontal block COLB2 formed of a plurality of, for example, four temperature adjustment apparatuses COL which are disposed horizontally to form the block and each of which adjusts the temperature of the semiconductor wafer W, which is subjected to heating processing in the hydrophobic processing apparatus AD and/or heater HP, to a predetermined temperature, for example, a temperature in a range between about 21° C. and about 23° C., preferably substantially 23° C. The heaters of the region HBB2 are configured to be able to perform heating/cooling processing on the semiconductor wafers W processed in the coaters COT of the coater COT block COTB.

Furthermore, under the heater group of the region HBB2, configured are blocks that correspond to the development processing apparatus DEV block DEVB as described above and that have the same vertical length as that of the development processing apparatus DEV block DEVB. From the above, configured is a horizontal block HPB3 formed of a plurality of, for example, four heaters HP which are disposed horizontally to form the block and each of which performs processing on the semiconductor wafer W at a predetermined temperature. Under the horizontal block HPB3 is disposed a horizontal block COLB3 formed of a plurality of, for example, four temperature adjustment apparatuses COL which are disposed horizontally to form the block and each of which adjusts the temperature of the semiconductor wafer W, which is subjected to heating processing in the heater HP of the horizontal block HPB3, to a predetermined temperature, for example, a temperature in a range between about 21° C. and about 23° C., preferably substantially 23° C. The heaters of the region HBB3 are configured to be able to perform heating/cooling processing on the semiconductor wafers W processed in the development processing apparatuses DEV of the development processing apparatus DEV block DEVB.

Still furthermore, under the heater group of the region HBB3, configured are blocks that correspond to the second development processing apparatus DEV block DEVB as described above and that have the same vertical length as that of the second development processing apparatus DEV block DEVB. From the above, configured is a horizontal block HPB4 formed of a plurality of, for example, four heaters HP which are disposed horizontally to form the block and each of which performs processing on the semiconductor wafer W at a predetermined temperature. Under the horizontal block HPB4 is disposed a horizontal block COLB4 formed of a plurality of, for example, four temperature adjustment apparatuses COL which are disposed horizontally to form the block and each of which adjusts the temperature of the semiconductor wafer W, which is subjected to heating processing in the heater HP of the horizontal block HPB4, to a predetermined temperature, for example, a temperature in a range between about 21° C. and about 23° C., preferably substantially 23° C. The heaters of the region HBB4 are configured to be able to perform heating/cooling processing on the semiconductor wafers W processed in the development processing apparatuses DEV of the second development processing apparatus DEV block DEVB.

On the cassette unit section CU side of the process unit section PU, a substrate delivering/receiving section 8 is disposed that is configured to be able to carry the semiconductor wafer W on a sheet basis to/from the substrate carrying in/out mechanism 2, while on the interface unit section IFU side of the process unit section PU, a substrate delivering/receiving section 9 is disposed that is configured to be able to carry the semiconductor wafer W on a sheet basis to/from the substrate carrying in/out mechanism 6.

Figure 4:
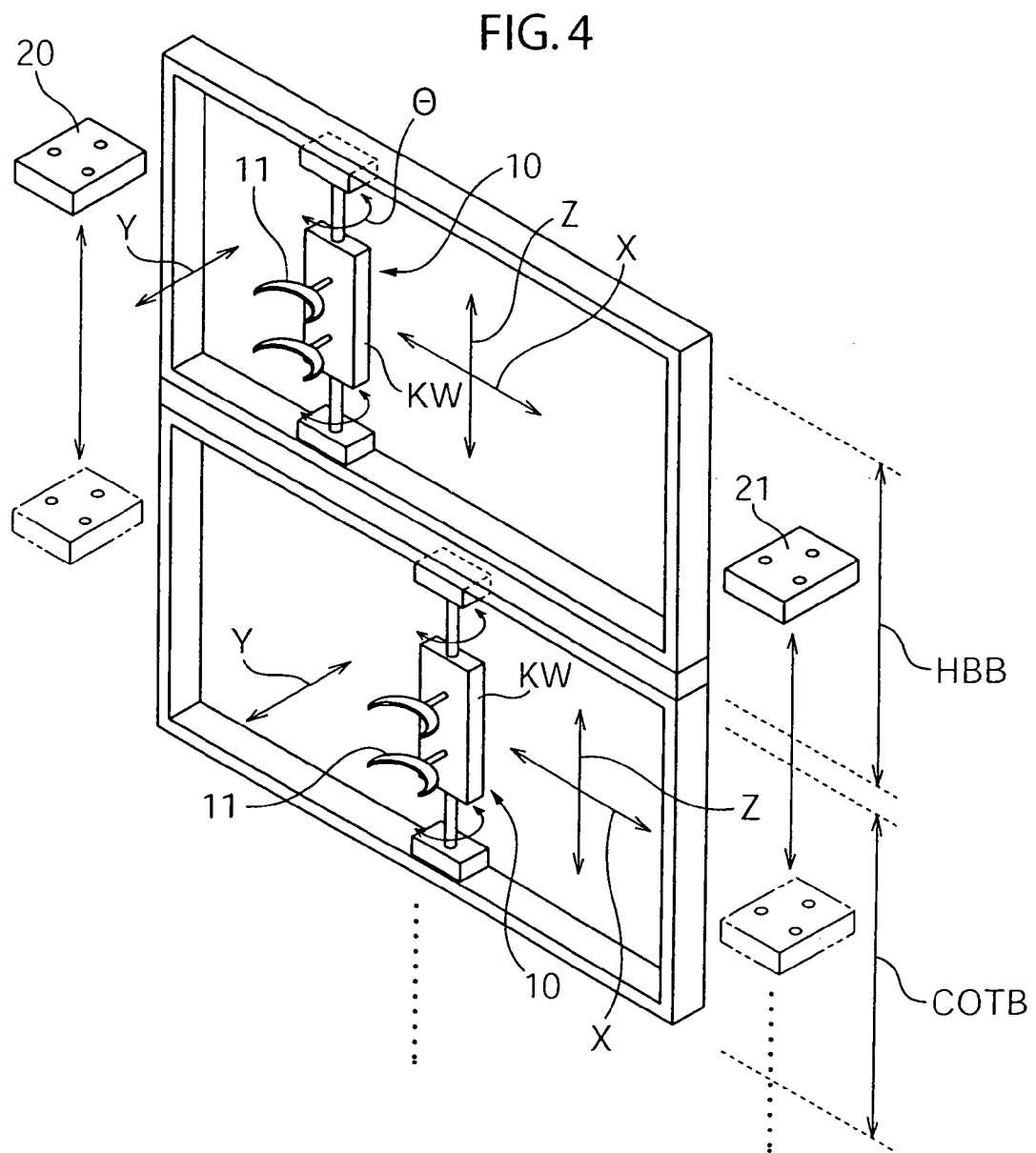
FIG. 4 is a schematic perspective view to explain principal part of a substrate carrying mechanism of FIG. 1.

A linearly-formed space portion is formed between the heater section HP and liquid processing apparatus section WP, and as shown in FIG. 4, at least one, for example, a plurality of stacked substrate carrying mechanisms 10 is disposed in the space portion. A travel region in the vertical direction of the substrate carrying mechanism 10 in the highest portion is configured to correspond to the antireflective film forming apparatus HB block HBB, have the same length as the vertical length of the antireflective film forming apparatus HB block HBB, and enable the mechanism 10 to carry the semiconductor wafer W to the antireflective film forming apparatuses HB in the region of the antireflective film forming apparatus HB block HBB and heaters HPB1, ADB1 and COLB1. A base KW of the substrate carrying mechanism 10 is configured to be movable in the X direction (the same direction as the horizontal direction of the horizontal block), Z direction (vertical direction), and θ rotation direction viewed in the figure. The base KW is provided with, at least one, for example, two arms 11. Each of the arms 11 is configured to be driven freely in the Y direction (extendable direction) independently of each other to carry the semiconductor wafer W to the antireflective film forming apparatuses HB, and heaters HPB1, ADB1 and COLB1. In addition, a plurality of arms is set for carrying in and carrying out of the semiconductor wafer W to/from a predetermined processing apparatus, and configured to improve throughput according to transport of the semiconductor wafer W.

In a position lower than the highest substrate carrying mechanism 10 is disposed the substrate carrying mechanism 10 for the coater COT block COTB. A travel region in the vertical direction of the substrate carrying mechanism 10 is configured to correspond to the coater COT block COTB, have the same length as the vertical length of the coater COT block CTOB, and enable the mechanism 10 to carry the semiconductor wafer W to the coaters COT in the region of the coater COT block COTB and heaters HPB2, ADB2 and COLB2. The base KW of the substrate carrying mechanism 10 is configured to be movable in the X direction (the same direction as the horizontal direction of the horizontal block), Z direction (vertical direction), and θ rotation direction viewed in the figure. The base KW is provided with, at least one, for example, two arms 11. Each of the arms 11 is configured to be driven freely in the Y direction (extendable direction) independently of each other to carry the semiconductor wafer W to the coaters COT, and heaters HPB2, ADB2 and COLB2. In addition, a plurality of arms is set for carrying in and carrying out of the semiconductor wafer W to/from a predetermined processing apparatus, and configured to improve throughput according to transport of the semiconductor wafer W.

In a position lower than the substrate carrying mechanism 10 for the coater COT block COTB is disposed the substrate carrying mechanism 10, not shown, for the first development processing apparatus DEV block DEVB. A travel region in the vertical direction of the substrate carrying mechanism 10 is configured to correspond to the development processing apparatus DEV block DEVB, have the same length as the vertical length of the development processing apparatus DEV block DEVB, and to enable the mechanism 10 to carry the semiconductor wafer W to the development processing apparatuses DEV in the region of the development processing apparatus DEV block DEVB and heaters HPB3 and COLB3. As in the foregoing, the base KW of the substrate carrying mechanism 10 is configured to be movable in the X direction (the same direction as the horizontal direction of the horizontal block), Z direction (vertical direction), and θ rotation direction viewed in the figure. The base KW is provided with, at least one, for example, two arms 11. Each of the arms 11 is configured to be driven freely in the Y direction (extendable direction) independently of each other to carry the semiconductor wafer W to the development processing apparatuses DEV, and heaters HPB3 and COLB3. In addition, a plurality of arms is set for carrying in and carrying out of the semiconductor wafer W to/from a predetermined processing apparatus, and configured to improve throughput according to transport of the semiconductor wafer W.

In a position lower than the substrate carrying mechanism 10 for the first development processing apparatus DEV block DEVB is disposed the substrate carrying mechanism 10, not shown, for the second development processing apparatus DEV block DEVB. A travel region in the vertical direction of the substrate carrying mechanism 10 is configured to correspond to the development processing apparatus DEV block DEVB, have the same length as the vertical length of the development processing apparatus DEV block DEVB, and enable the mechanism 10 to carry the semiconductor wafer W to the development processing apparatuses DEV in the region of the development processing apparatus DEV block DEVB and heaters HPB4 and COLB4. As in the foregoing, the base KW of the substrate carrying mechanism 10 is configured to be movable in the X direction (the same direction as the horizontal direction of the horizontal block), Z direction (vertical direction), and θ rotation direction viewed in the figure. The base KW is provided with, at least one, for example, two arms 11. Each of the arms 11 is configured to be driven freely in the Y direction (extendable direction) independently of each other to carry the semiconductor wafer W to the development processing apparatuses DEV, and heaters HPB4 and COLB4. In addition, a plurality of arms is set for carrying in and carrying out of the semiconductor wafer W to/from a predetermined processing apparatus, and configured to improve throughput according to transport of the semiconductor wafer W.

Further, as shown in FIG. 1, substrate delivering/receiving stations 20 and 21 configured to be able to deliver and receive the semiconductor wafer W to/from each of a plurality of stacked substrate delivering/receiving mechanisms 10 are disposed on at least one end in the X direction of the substrate carrying mechanism 10. The substrate delivering/receiving stations 20 and 21 are configured to be movable in the Z direction (vertical direction) to be able to deliver and receive the semiconductor wafer W to/from each of the substrate delivering/receiving mechanisms 10. Further, for transport of the semiconductor wafer W between the substrate delivering/receiving stations 20, 21 and substrate delivering/receiving section 8 and 9, as shown in FIG. 1, another substrate carrying mechanisms TR1 and TR2 are configured to carry the semiconductor wafer W to the substrate delivering/receiving stations 20 and 21 with the stations halted in a predetermined height position, respectively.

In this embodiment, the substrate carrying mechanism 10 for the second development processing apparatus DEV block DEVB is provided in the position lower than the substrate carrying mechanism 10 for the first development processing apparatus DEV block DEVB. Alternately, since the development processing apparatus DEV blocks DEVBs are a processing group that performs the same processing, instead of providing two substrate carrying mechanisms 10 for the first and second development processing apparatus DEV blocks DEVBs, a single substrate carrying mechanism 10 may support the first and second development processing apparatus DEV blocks DEVBs. In this case, the heaters as shown in FIG. 3 in the order of HPB3→COLB3→HPB4→COLB4, from the top to bottom, may be changed to the order of HPB3→HPB4→COLB3→COLB4, from the top to bottom. In addition, the vertical length of the first development processing apparatus DEV block DEVB is substantially the same as the vertical length of the second development processing apparatus DEV block DEVB, the vertical length of the antireflective film forming apparatus HB block HBB is substantially the same as the vertical length of the coater COT block COTB, and the vertical length of the first development processing apparatus DEV block DEVB is smaller than the vertical length of the antireflective film forming apparatus HB block HBB. However, when any limitations and the like are not imposed on the height of the apparatus, the vertical length of the first development processing apparatus DEV block DEVB may be substantially the same as the vertical length of the antireflective film forming apparatus HB block HBB.

In addition, the arm 11 of each substrate carrying mechanism 10 is configured to carry the semiconductor wafer W freely to/from the heater and liquid processing apparatus as described previously via a carrying in/out opening 16 which is provided in each of the heaters and liquid processing apparatuses and configured to be openable and closable. In addition, the carrying in/out opening 16 is provided with an opening/closing mechanism not shown, for example, a shutter, and each carrying in/out opening 16 is configured to be openable and closable independently by the shutter. Further, the substrate delivering/receiving stations 20 and 21 are configured to be managed by a temperature adjustment mechanism that adjusts the temperature of the semiconductor wafer W to a predetermined temperature, for example, a temperature in a range between about 21° C. and about 23° C., preferably substantially 23° C. as room temperature.

Figure 5:
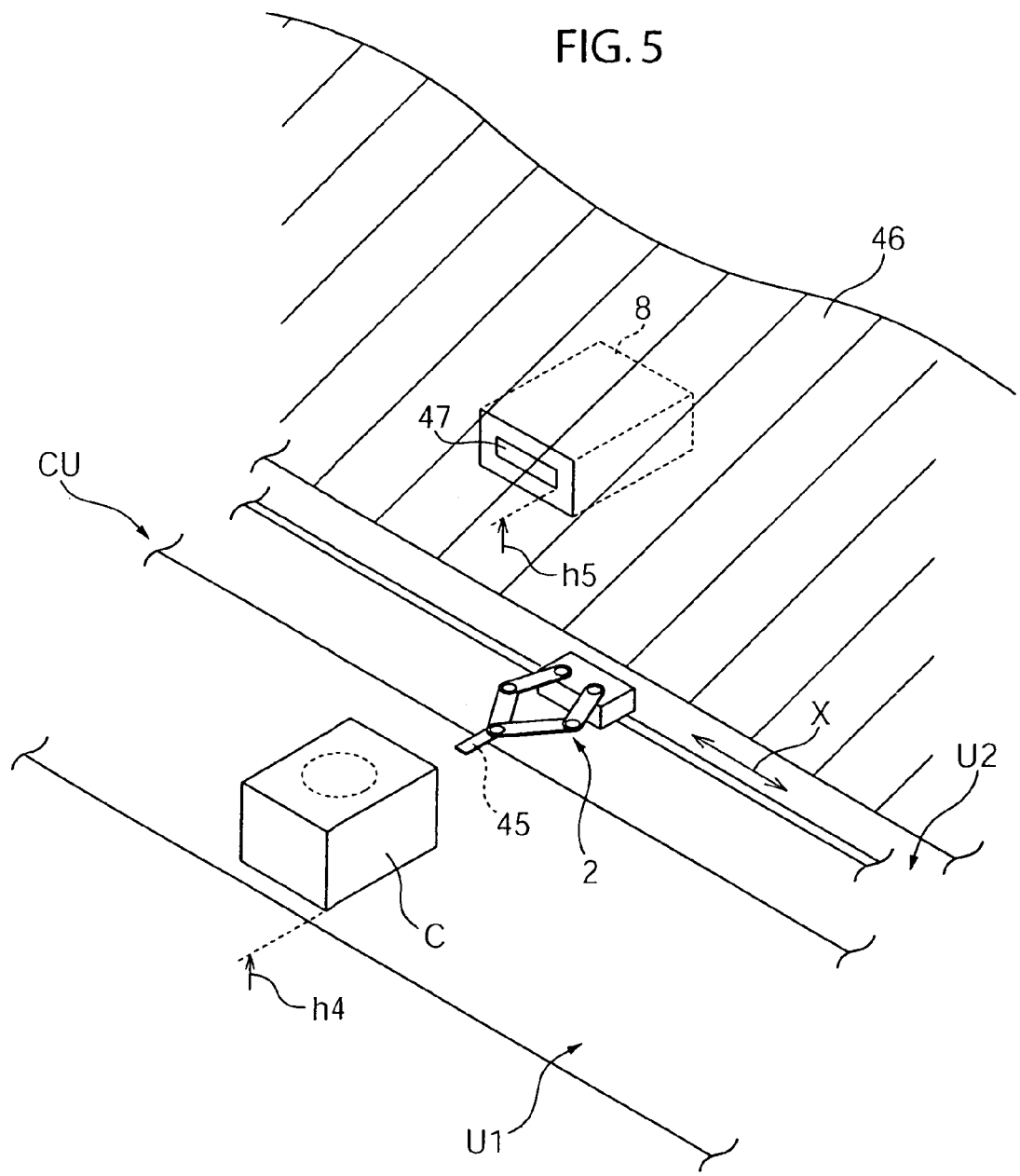
FIG. 5 is a schematic perspective view to explain principal part of a cassette unit section of FIG. 1.
Figure 6:
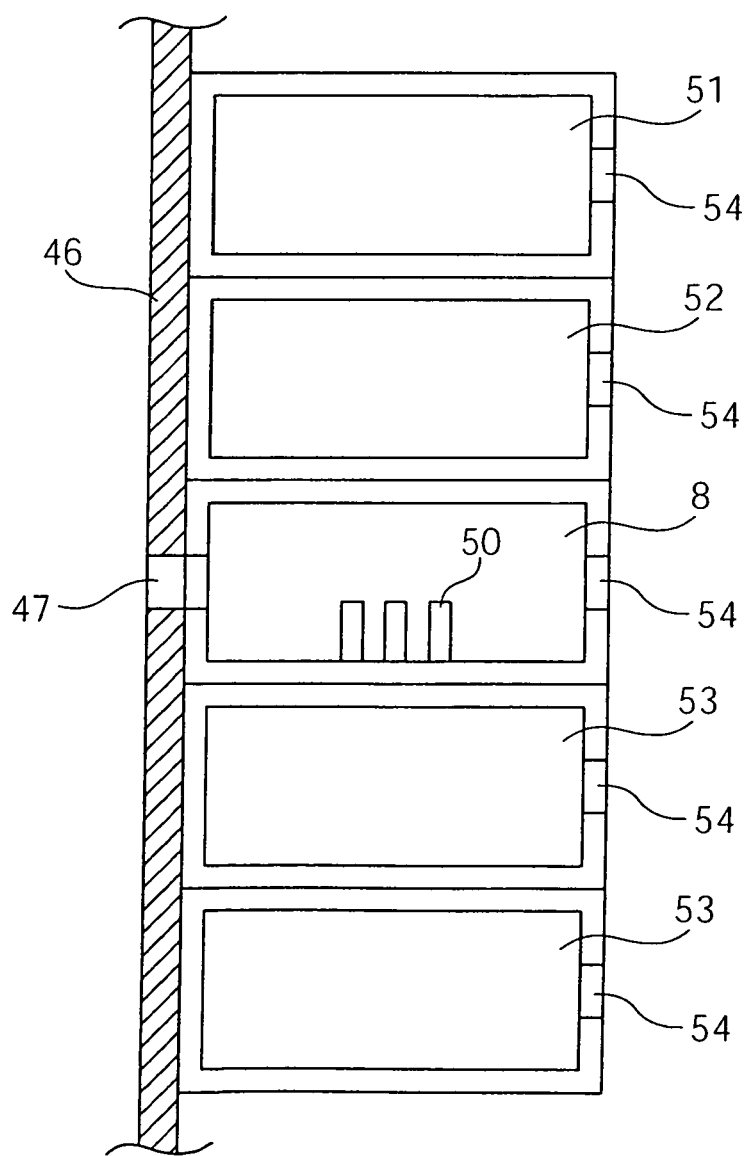
FIG. 6 is a schematic cross-sectional view to explain principal part of a substrate delivering/receiving section of FIG. 1.

As shown in FIG. 5, the substrate carrying in/out mechanism 2 in the cassette unit section CU is configured to be self-propelled in the X direction (X axis), and is provided with an arm 45 configured to be movable in the vertical direction (Z axis), extendable direction (Y axis) and rotation direction (θ axis). Further, a wall 46 is disposed between the cassette unit section CU and process unit section PU, configured to interrupt the atmosphere between the space inside the cassette unit section CU and the space inside the process unit section PU, and provided with an opening 47 of the substrate delivering/receiving section 8, as shown in FIG. 6. The opening 47 is configured to be openable and closable by an opening/closing mechanism not shown, for example, a shutter.

A height position h5 of the opening 47 is set at a position higher than a height position h4 where a cassette C is mounted. Further, the opening 47 is disposed in a position higher than a height position of the arm 45 when the arm 45 of the substrate carrying in/out mechanism 2 travels in the X direction (the longitudinal direction of the cassette unit section CU). The relationship of the height position is that the height position h5 of the opening 47>height position of the arm 45 of the substrate carrying in/out mechanism 2 when the arm 45 travels in the X direction>height position h4 where the cassette C is mounted. By this means, it is possible to prevent the mist and like from the substrate carrying in/out mechanism 2 from entering the process unit section PU side. In addition, above the cassette unit section CU is provided a gas introducing mechanism not shown to flow downward a gas such as clean air and the like toward the cassette unit section CU.

The substrate delivering/receiving section 8 of the process unit section PU is provided with a plurality of support mechanisms, for example, support pins 50 configured to be movable up and down to deliver and receive the semiconductor wafer W, and to be able to deliver and receive the semiconductor wafer W to/from the substrate carrying in/out mechanism 2 or substrate carrying mechanism 10. Further, in a position above the substrate delivering/receiving section 8 is disposed a heater 51 that performs heat treatment on the semiconductor wafer W with a first predetermined temperature. Between the heater 51 and substrate delivering/receiving section 8 is disposed a heater 52 that performs heat treatment on the semiconductor wafer W with a second predetermined temperature lower than the first temperature. In a position under the substrate delivering/receiving section 8 is disposed a plurality of temperature adjustment mechanisms 53 to adjust (cool) the temperature of the semiconductor wafer W treated in the heaters 51 and 52 to a predetermined temperature, for example, the temperature substantially the same as the ambient temperature inside the process unit section PU, for example, the temperature in a range between about 21° C. and about 23° C., preferably of substantially 23° C.

In addition, the substrate carrying mechanism TR1 carries the semiconductor wafer W to/from the temperature adjustment mechanisms 53 and heaters 51 and 52, while the substrate carrying in/out mechanism 2 is configured not to be able to access the mechanisms 53 and heaters and 52. Further, openings 54 on the process unit section PU side of the substrate delivering/receiving section 8, temperature adjustment mechanisms 53 and heaters 51 and 52 are configured to be openable and closable by an opening/closing mechanism not shown, for example, a shutter. A filter section not shown is provided above each of the substrate carrying in/out mechanism section U2 of the cassette unit section CU, process unit section PU and interface unit section IFU, and configured to supply the temperature/humidity air with the temperature and humidity of respective set values to each of the units. The temperature/humidity air is configured to be set at a predetermined amount by each exhaust setting mechanism to be recovered from an exhaust hole provided under each unit, and it is thus configured that a down-flow of the temperature/humidity air is formed inside each unit.

Further, the pressure of each of the substrate carrying in/out mechanism section U2 of the cassette unit section CU, process unit section PU and interface unit section IFU is set by the exhaust setting mechanism thereof so that the pressure of the process unit section PU is set to be higher than both the pressure of the substrate carrying in/out mechanism section U2 of the cassette unit section CU, and the pressure of the interface unit section IFU, and that the pressure inside the exposure apparatus 3 is set to be higher than the pressure of the interface unit section IFU. It is thus configured to prevent unnecessary mist from entering the process unit section PU or exposure apparatus 3 to be a factor having an adverse effect on the processing of the semiconductor wafer W. Further, as compared with the level of oxygen and/or acid gas (NOX, SOX, $H_2S$, $CO_2$ and the like), base gas (ammonia, amine and the like), and/or moisture contained in the atmosphere of the cassette unit section CU, the level contained in the atmosphere of the process unit section PU and/or interface unit section IFU is substantially set to be lower than the level of the section CU. This is because of improving the yield of the processing of the semiconductor wafer by reducing effects of the gases particularly in the processing prior or subsequent to exposure.

Figure 7:
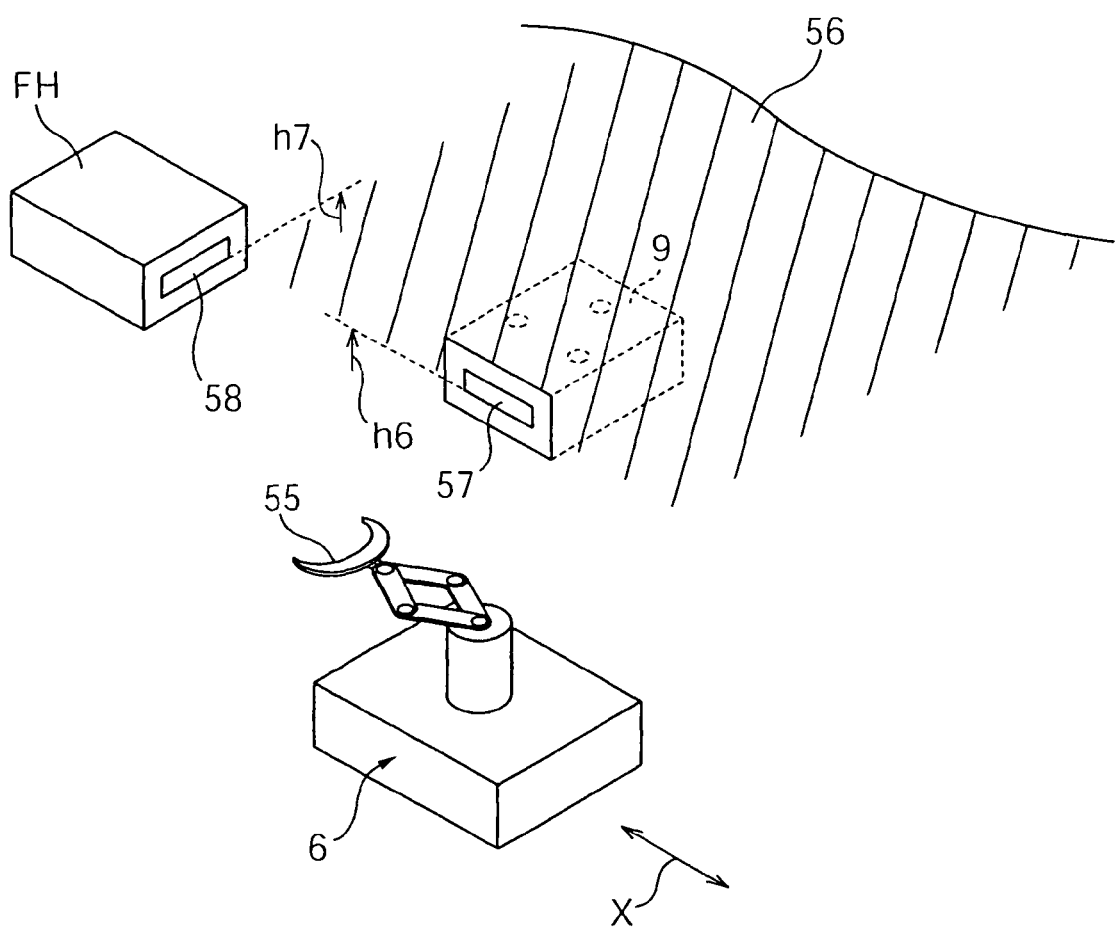
FIG. 7 is a schematic perspective view to explain principal part of an interface unit section of FIG. 1.

As shown in FIG. 7, the substrate carrying in/out mechanism 6 in the interface unit section IFU is configured to be self-propelled movable in the X direction (X axis), and provided with an arm 55 configured to be movable in the vertical direction (Z axis), extendable direction (Y axis) and rotation direction (θ axis). Further, a wall 56 is provided between the interface unit section IFU and process unit section PU, configured to interrupt the atmosphere between the space inside the interface unit section IFU and the space inside the process unit section PU, and provided with an opening 57 of the substrate delivering/receiving section 9. The opening 57 is configured to be openable and closable by an opening/closing mechanism not shown, for example, a shutter.

A height position h6 of the opening 57 is set at a position lower than a height position h7 of an opening of a heating processing chamber FH. Further, the opening 57 is disposed in a position higher than a height position of the arm 55 when the arm 55 of the substrate carrying in/out mechanism 6 travels in the X direction (the longitudinal direction of the interface unit section IFU). The relationship of the height position is that the height position h6 of the opening 57>height position of the arm 55 of the substrate carrying in/out mechanism 6 when the arm 55 travels in the X direction>height position h7 of the opening 58 of the heating processing chamber FH. It is thus configured to prevent the heat from the heating processing chamber FH and/or mist from the heating processing chamber FH and/or substrate carrying in/out mechanism 2 and like from entering the process unit section PU side. In addition, the height position h6 of the opening 57 is set to be substantially the same as the height position h5 of the opening 47, and thus configured to improve the efficiency of carrying by the substrate carrying mechanism 10. In addition, under and above the substrate delivering/receiving section 9 are disposed the heaters or temperature adjustment apparatuses configured to be stacked in the same way as in the substrate delivering/receiving section 8.

Figure 8:
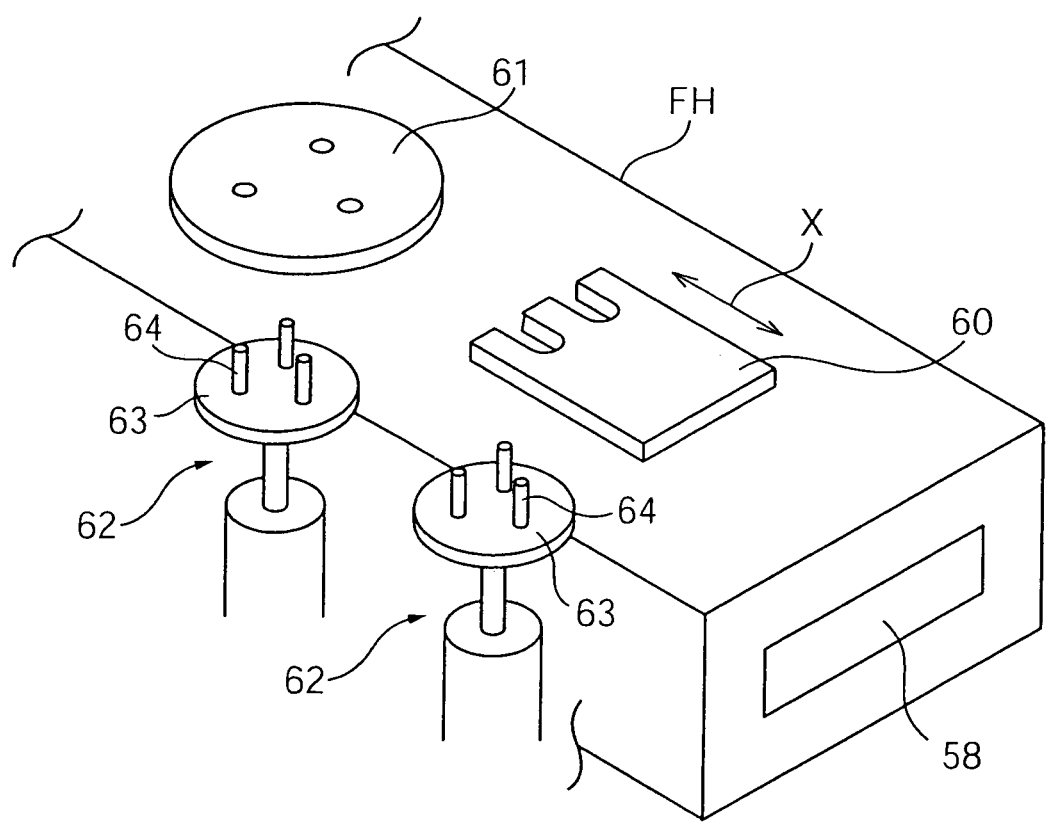
FIG. 8 is a schematic perspective view to explain principal part of a heat treatment chamber of FIG. 1.

As shown in FIG. 8, the heating processing chamber FH is provided with a rectangular temperature adjustment mechanism 60 that adjusts (cools) the temperature of the semiconductor wafer W to a predetermined temperature, for example, the ambient temperature inside the interface unit section IFU, for example, to a temperature in a range between about 21° C. and about 23° C., preferably substantially 23° C., and a heating mechanism 61 that performs post exposure baking (PEB) on the semiconductor wafer W subjected to the exposure processing in the exposure apparatus 3 at a predetermined temperature. The temperature adjustment mechanism 60 is configured to be movable in the X direction (X axis), and moving up/down mechanisms 62 are provided under the temperature adjustment mechanism 60 in the home position of the mechanism 60 and in a position lower than the heating mechanism 61 to be configured to be able to deliver and receive the semiconductor wafer W to/from the temperature adjustment mechanism 60 and heating mechanism 61, respectively. Each of the moving up/down mechanisms 62 has a plurality of support mechanisms, for example, support pins 64 on a base 63, and is configured to be able to support the semiconductor wafer W from the backside in point contact by the support pins 64.

The temperature adjustment mechanism 60 is further provided with notches 65 not in contact with the support pins 64 of the moving up/down mechanism 62 on the heating mechanism 61 side, and configured to travel to a position above the heating mechanism 61 to be able to deliver and receive the semiconductor wafer W using the support pins of the moving up/down mechanism 62 on the heating mechanism 61 side. In addition, the opening 58 is provided in the X direction (the longitudinal direction of the heating processing chamber FH), and is configured to be openable and closable by an opening/closing mechanism not shown, for example, a shutter. The moving up/down mechanism 62 on the temperature adjustment mechanism 60 side is configured to be able to deliver and receive the semiconductor wafer W to/from the arm 55 of the substrate carrying in/out mechanism 6, as well as delivering and receiving the wafer W to/from the temperature adjustment mechanism 60.

Figure 9:
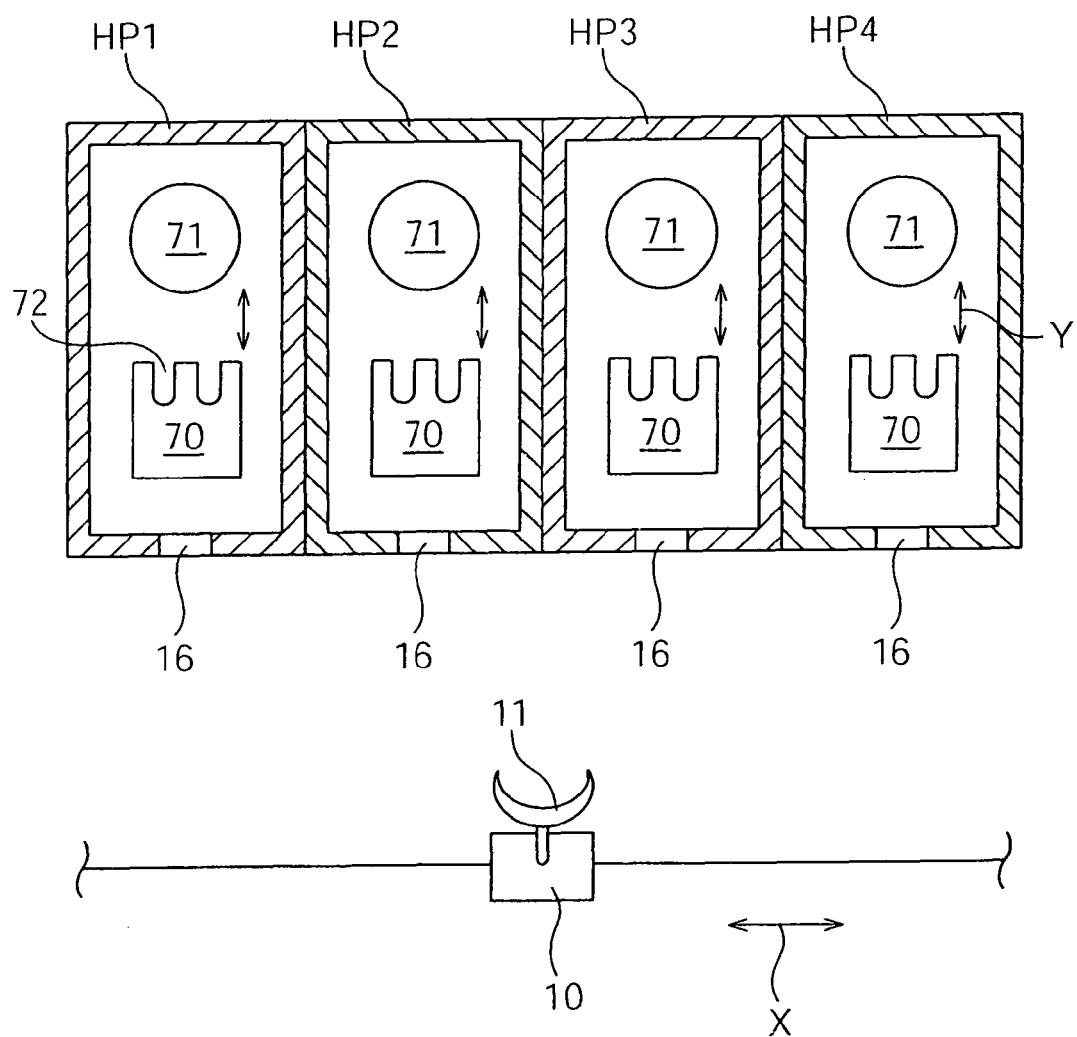
FIG. 9 is a schematic plan view to explain principal part of the heat treatment apparatus of FIG. 1.

As shown in FIG. 9, each of the heaters (i.e. heat treatment apparatus) HP1 to HP4 and the like of the heater blocks (i.e. heat treatment apparatus blocks) HPB1 to HPB4 has substantially the same configuration as that of the heating processing chamber FH, and is provided with a rectangular temperature adjustment mechanism 70 that adjusts (cools) the temperature of the semiconductor wafer W to a predetermined temperature, for example, the ambient temperature inside the process unit section PU, for example, to a temperature in a range between about 21° C. and about 23° C., preferably substantially 23° C., and a heating mechanism 71 that heats and treats the semiconductor wafer W at a predetermined temperature. The temperature adjustment mechanism 70 is configured to be movable in the Y direction, and moving up/down mechanisms not shown are provided under the temperature adjustment mechanism 70 in the home position of the mechanism 70 and in a position lower than the heating mechanism 71 and configured to be able to deliver and receive the semiconductor wafer W to/from the temperature adjustment mechanism 70 and heating mechanism 71, respectively. Each of the moving up/down mechanisms has a plurality of support mechanisms, for example, support pins and is configured to be able to support the semiconductor wafer W from the backside in point contact by the support pins.

The temperature adjustment mechanism 70 is further provided with notches 72 not in contact with the support pins of the moving up/down mechanism on the heating mechanism 71 side, and configured to travel to a position above the heating mechanism 71 to be able to deliver and receive the semiconductor wafer W using the support pins of the moving up/down mechanism on the heating mechanism 71 side. In addition, the opening 16 of each of the heaters HP1 to HP4 is provided in the Y direction (the longitudinal direction of the heating processing chamber FH), and is configured to be openable and closable by an opening/closing mechanism not shown, for example, a shutter. The moving up/down mechanism on the temperature adjustment mechanism 70 side is configured to be able to deliver and receive the semiconductor wafer W to/from the arm 11 of the substrate carrying mechanism 10, as well as delivering and receiving the wafer W to/from the temperature adjustment mechanism 70.

Figure 10:
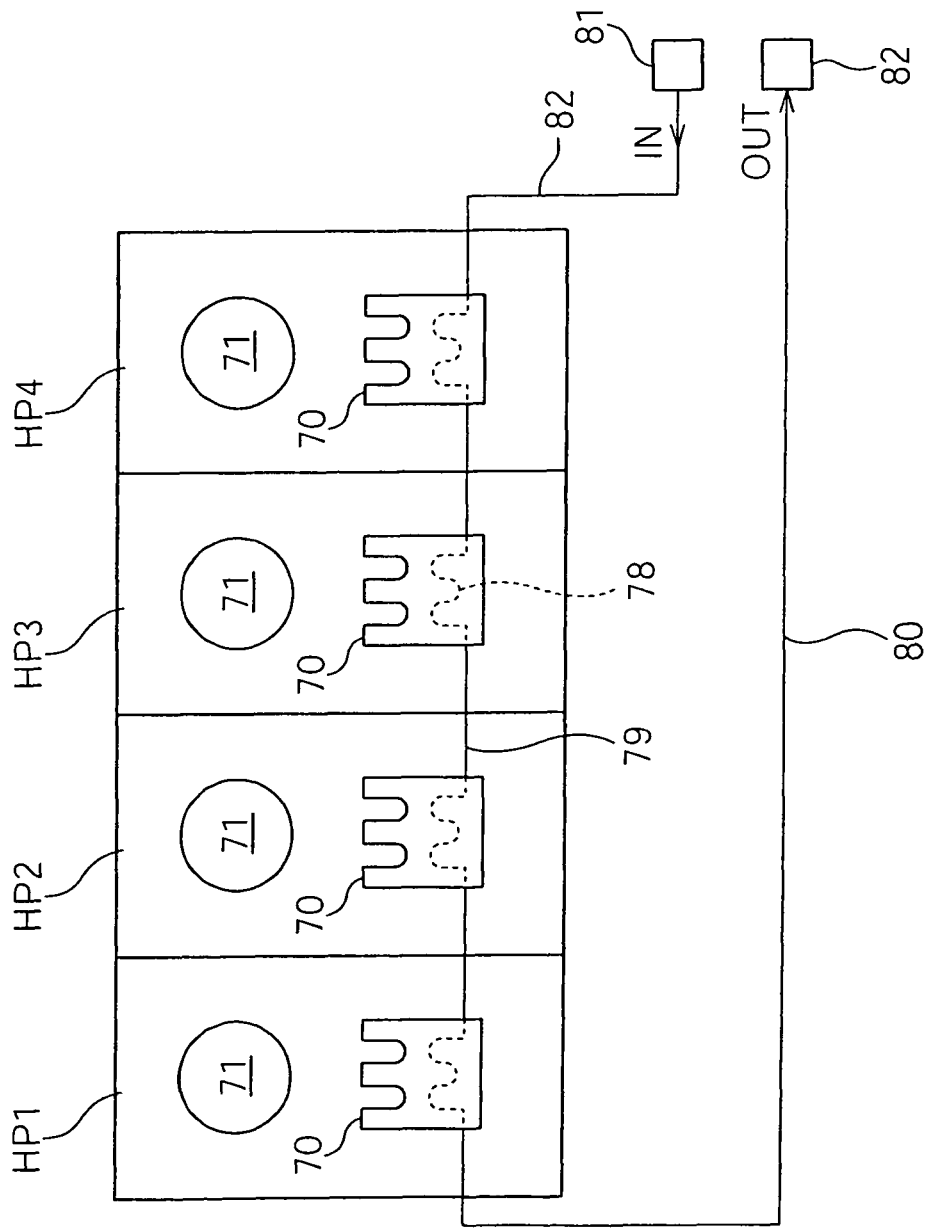
FIG. 10 is a schematic view to explain principal part of the heat treatment apparatus of FIG. 9.

Further, as shown in FIG. 10, each temperature adjustment mechanism 70 is provided with a flowing path 78 to flow a cooling medium, for example, cooling water to set the temperature adjustment mechanism 70 at a predetermined temperature, for example, a temperature in a range between about 21° C. and about 23° C., preferably substantially 23° C. The flowing path 78 is configured to supply the cooling water from a cooling medium supply mechanism 81 via a pipe 82. For example, it is configured that the cooling water supplied to the temperature adjustment mechanism 70 of the heater HP4 from the cooling medium supply mechanism 81 as the cooling liquid supply mechanism is supplied to the flowing path 78 of the temperature adjustment mechanism 70 of a subsequent-stage heater, for example, heater HP3 by a connection pipe 79 via the flowing path 78, the cooling water supplied to the temperature adjustment mechanism 70 of the heater HP3 is supplied to the flowing path 78 of the temperature adjustment mechanism 70 of a subsequent-stage heater, for example, heater HP2 by the connection pipe 79 via the flowing path 78, and that the cooling water supplied to the temperature adjustment mechanism 70 of the heater HP2 is supplied to the flowing path 78 of the temperature adjustment mechanism 70 of a subsequent-stage heater, for example, heater HP1 by the connection pipe 79 via the flowing path 78.

Figure 11:
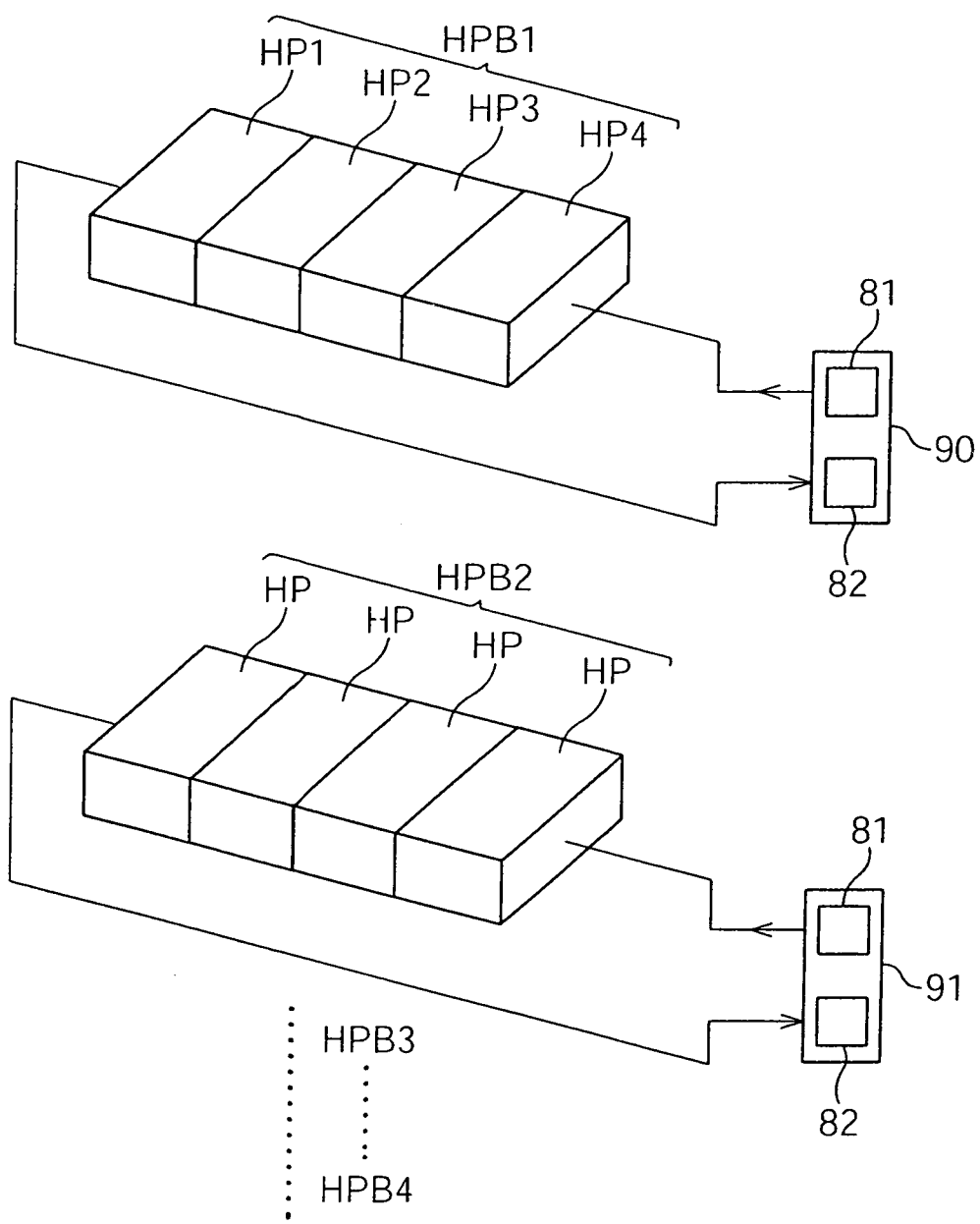
FIG. 11 is a schematic perspective view to explain principal part of the heat treatment apparatus of FIG. 9.

Further, the cooling water from the flowing path 78 of the temperature adjustment mechanism 70 of the heater HP1 is returned to a cooling medium recovery mechanism 83 via a pipe 80 that collects the cooling medium. In addition, it is configured in this embodiment that the cooling water flows from the heater HP4 side to the heater HP1 side, but the flow of the cooling water can be set as appropriate. Further, as shown in FIG. 11, it is configured that the cooling medium supply mechanism 81 and cooling medium recovery mechanism 83 are managed on a basis of a horizontal block of the heaters, and that cooling water ports 90 (for the heater block HPB1) and 91 (for the heater block HPB2) in each of which the cooling medium supply mechanism 81 and cooling medium recovery mechanism 83 are arranged are disposed for heaters HPB1 to HPB4. In addition, not shown in FIG. 11, the cooling water port for the heater block HPB3 is "92" as shown in FIG. 12, and the cooling water port for the heater block HPB4 is "93" as shown in FIG. 12.

Figure 12:
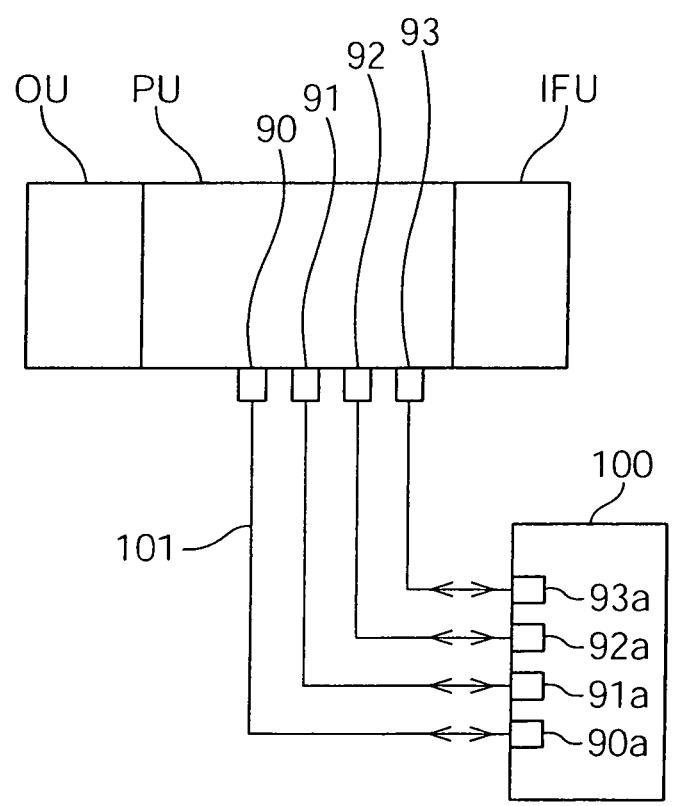
FIG. 12 is a schematic plan view to explain principal part of the heat treatment apparatus of FIG. 9.
Figure 13:
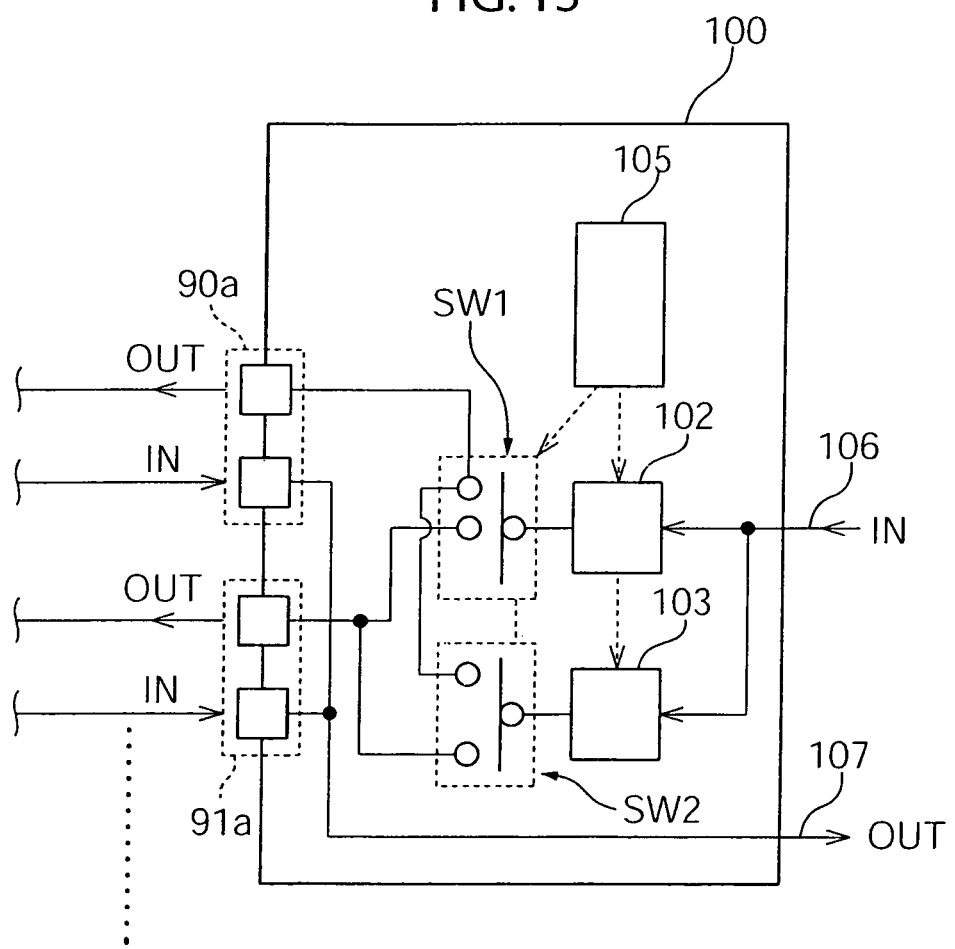
FIG. 13 is a schematic view to explain principal part of a utility apparatus of FIG. 12.

As shown in FIGS. 12 and 13, the cooling water ports 90 to 93 are disposed in predetermined positions of the process unit section PU. The cooling water ports 90 to 93 are configured to be connected to a utility apparatus disposed outside the apparatus, for example, a cooling medium utility apparatus 100 via respective pipes 101 corresponding to the cooling water ports 90 to 93. The cooling medium utility apparatus 100 is provided with ports 90a to 93a corresponding to the cooling water ports 90 to 93. Further, the cooling medium utility apparatus 100 is provided with a water introduction port 106 that takes in the water for cooling water from the outside of the cooling medium utility device 100, and with a water discharge port 107 that discharges the cooling water used in the substrate processing apparatus 1 from the ports 90a to 93a.

Further, the cooling medium utility apparatus 100 is provided with at least one temperature adjustment mechanism, for example, temperature adjustment mechanisms 102 and 103 to set the water as a cooling medium introduced from the water introducing port 106 at a predetermined temperature used in the substrate processing apparatus, for example, at a temperature in a range between about 21° C. and about 23° C., preferably at substantially 23° C., by instructions from a control mechanism 105. The cooling water set for the predetermined temperature by the temperature adjustment mechanisms 102 and 103 is configured to enable switching to select between switching mechanisms, for example, a switching mechanism SW1 route and switching mechanism SW2 route each comprised of a valve and the like, by instructions from the control mechanism 105, and to be sent from the temperature adjustment mechanism 102 or 103 collectively to the substrate processing apparatus 1 from respective OUT sides via the ports 90a to 93a. In addition, in this embodiment, a plurality of temperature adjustment mechanisms, i.e. two temperature adjustment mechanisms, 102 and 103, are provided, but naturally, one temperature adjustment mechanism may support the apparatus.

Figure 14:
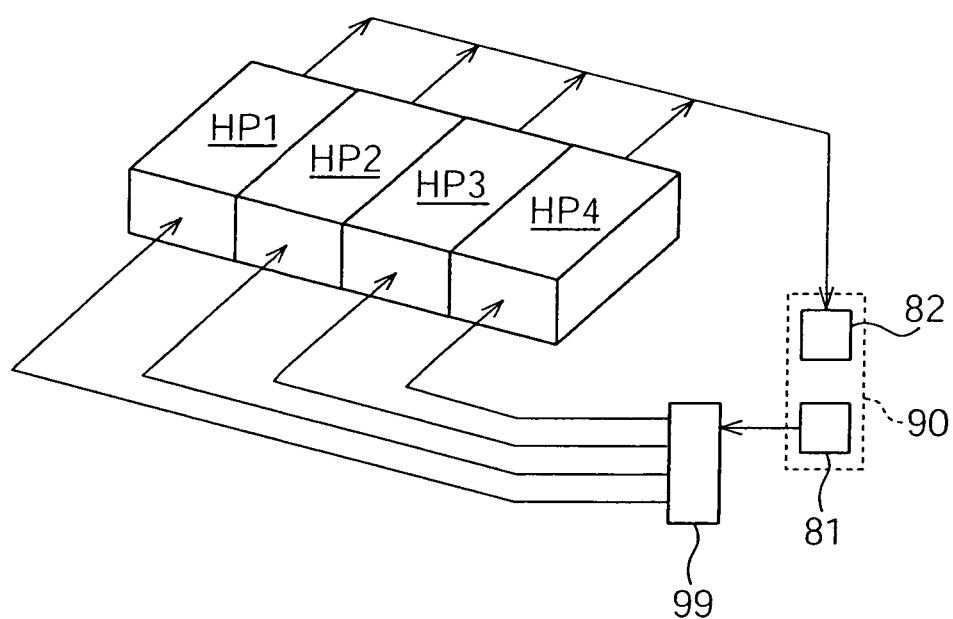
FIG. 14 is a schematic perspective view to explain another embodiment according to the heat treatment apparatus of FIG. 11.

Described next is another embodiment of the cooling medium supply mechanism 81 and cooling medium recovery mechanism 83 described previously. As shown in FIG. 14, the cooling water supplied from the cooling medium supply mechanism 81 is configured to be once branched to a plurality of flows by a branch mechanism 99, and supplied to the temperature adjustment mechanism of each heater of the horizontal block of the heaters. Further, the cooling water recovered from the temperature adjustment mechanism of each heater is configured to be collectively recovered to the cooling medium recovery mechanism 83. Thus, the cooling water is supplied independently via each supply line to the temperature adjustment mechanism of each heater, and it is thus possible to provide the apparatus with a higher level of safety.

Described next is the switching between the switching mechanisms SW1 and SW2. It is assumed that the cooling water is first sent from the OUT side of each of the ports 90a to 93a to the substrate processing apparatus 1 via the switching mechanism SW1 route. The cooling water flows for each horizontal block of heaters, i.e. flows into the heaters HPB1 to HPB4, and recovered to the IN side of each of the ports 90a to 93a for each horizontal block. The IN side of each of the ports 90a to 93a of the recovered cooling water is provided with a temperature detecting mechanism that detects the temperature of the recovered cooling water for each of the ports 90a to 93a. The information of the temperature detecting mechanisms is managed by the control mechanism 105, and it is configured that when at least one of respective temperature detecting mechanisms of the IN sides of the ports 90a to 93a detects a value outside set range values, the control mechanism 105 switches from the switching mechanism SW1 route to the switching mechanism SW2 route, while transmitting a first abnormal signal to a control mechanism of the substrate processing side to report the information. Thus, the cooling water is managed for each horizontal block of the heaters.

In addition, the temperature adjustments mechanisms may not be particularly provided on the OUT sides of the ports 90a to 93a of the cooling water. This is because the temperature of the sent cooling water is managed by the temperature adjustments mechanisms 102 and 103. Further, when the detecting mechanism detects a value outside the set range values also after switching to the switching mechanism SW2 route, the recovery line falling outside the set range temperature values among the IN sides of the ports 90a to 93a is configured to transmit a second abnormal signal to the control mechanism of the substrate processing apparatus 1 side to report the information. The temperature of the temperature adjustment mechanism 70 of each heater HP is configured to be detected by a temperature detecting mechanism, but it is not clear on whether the cooling medium utility apparatus 100 has the problem or the temperature adjustment mechanism 70 of each heater HP has the problem. Therefore, the control mechanism of the substrate processing apparatus 1 side is configured to judge the abnormal condition based on the information of the temperature detecting mechanism of the temperature adjustment mechanism 70 of each heater HP and the above-mentioned first and/or second abnormal signal to be able to identify a location of the problem. It is thus configured to greatly improve the safety of the apparatus itself by management of the horizontal block and the dedicated temperature detecting mechanism of the temperature adjustment mechanism 70 of each heater.

Figure 15:
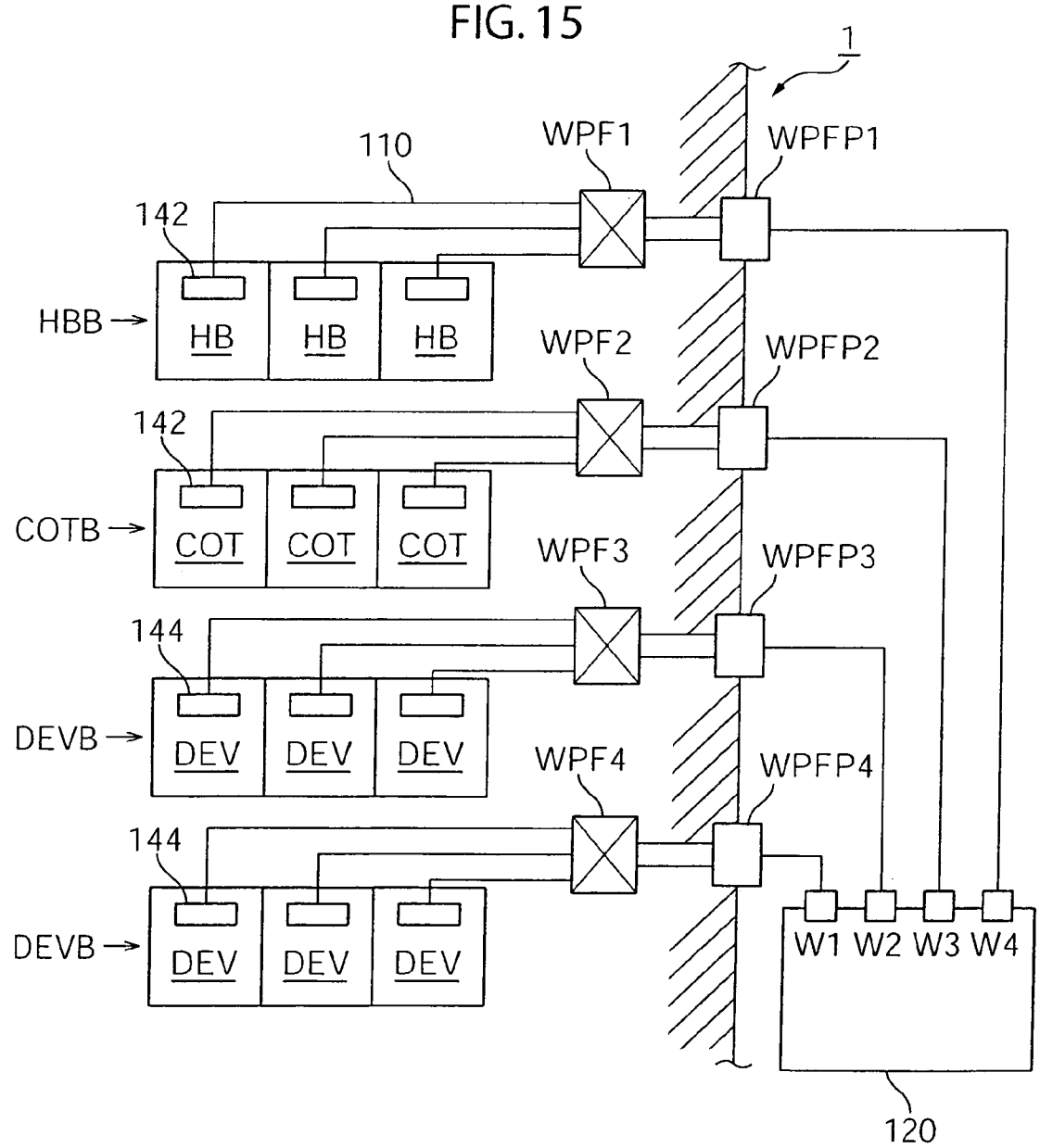
FIG. 15 is a schematic view to explain utility supply according to the liquid processing apparatus of FIG. 1.

Further, for utility, for example, supply of a gas with adjusted predetermined temperature and humidity to each of liquid processing apparatuses of each of horizontal blocks HBB, COTB, DEVB1 and DEVB2, as shown in FIG. 15, it is configured that a utility apparatus disposed outside the substrate processing apparatus 1, for example, a gas utility apparatus 120 that supplies the gas with adjusted predetermined temperature and humidity sends the gas to ports WPFP1 to WPFP4 provided in predetermined positions of the substrate processing apparatus 1 independently through a number of lines corresponding to the number horizontal blocks HBB, COTB, DEVB1 and DEVB2, in this case, through four lines via ports W1 to W4 of the gas utility apparatus 120. Further, by gas branch mechanisms WPF1 to WPF4, the gas sent to the ports WPFP1 to WPFP4 is configured to be supplied to each liquid processing apparatus of each liquid processing apparatus horizontal block via an independent pipe 110, respectively.

Figure 16:
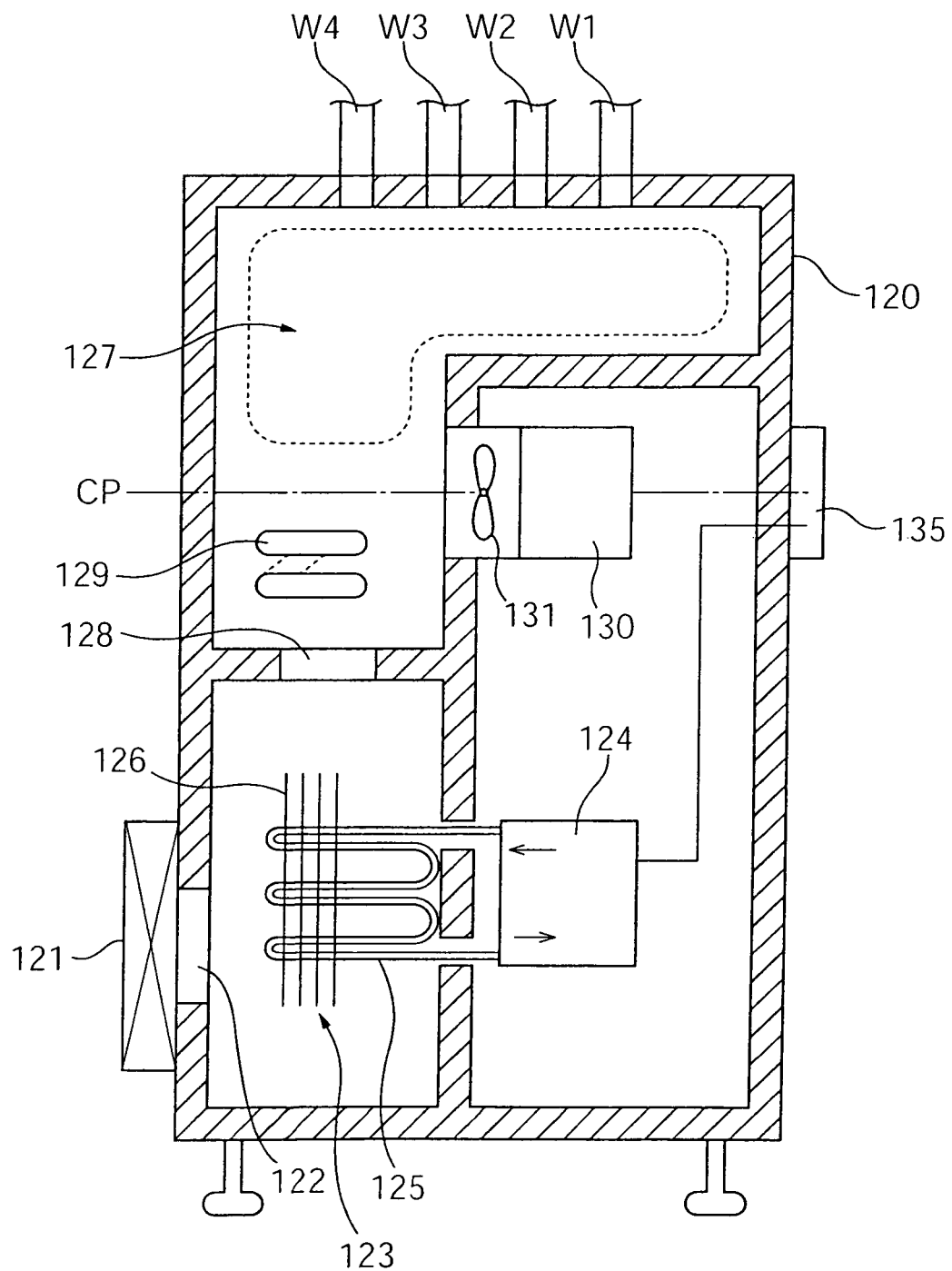
FIG. 16 is a schematic cross-sectional view to explain a utility apparatus of FIG. 15.

Furthermore, as shown in FIG. 16, in the gas utility apparatus 120, the ports W1 to W4 are provided in an upper position of the apparatus 120. The reason of such installation is that the footprint of the apparatus can be decreased. Further, the gas utility apparatus 120 is configured to take a gas prior to adjustments of the temperature and humidity inside the apparatus from outside the apparatus through a gas introducing portion 122 via a filter 121. The gas taken in through the gas introducing portion 122 is taken in a cooling portion 123 as the first space portion, and it is configured that cooling plates 126 each in a predetermined shape, for example, in the shape of a rectangle, provided in a cooling medium flowing pipe 125, are cooled by a cooling medium flowing through the cooling medium flowing pipe 125 of a cooling medium supply mechanism 124 and that the introduced gas can be cooled. Further, in a position above the cooling plates 126 is provided an introducing portion 128 as a path (flowing portion) to introduce the gas cooled by the cooling plates 126 to a second space portion 127.

Figure 17:
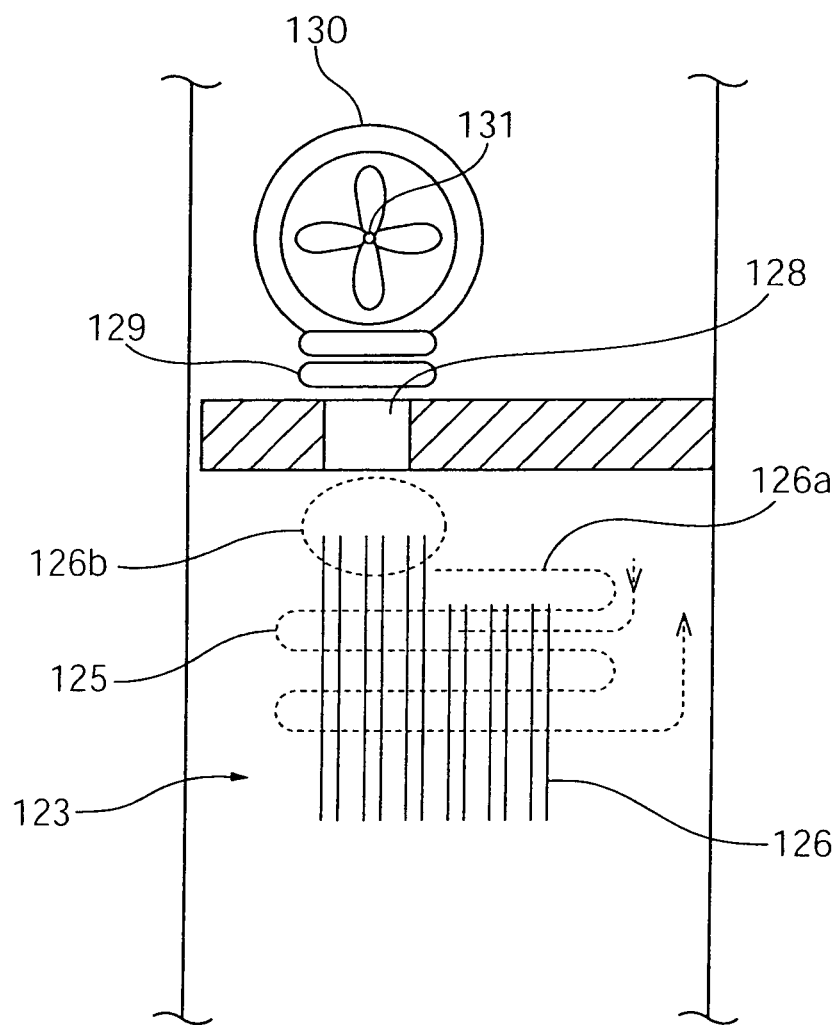
FIG. 17 is a schematic view to explain the utility apparatus of FIG. 16.

In addition, for the relationship between the introducing portion 128 and cooing plates 126, as shown in FIG. 17, it is configured that the introducing portion 128 is disposed in part of the region of the cooling plates 126, for example, in the region of one end, and that the height of the cooling plates 126b disposed in positions under the introducing portion 128 extends to a position higher than the height of cooling plates 126a in positions except the positions immediately under the introducing portion 128. This is because of the effects of cooling the gas in the entire region of the cooling portion 123, and sending the cooled gas to be sent to the introducing portion 128 to the vicinity of the introducing portion 128 without changing the temperature of the cooled gas. Further, for connection between a plurality of cooling plates 126 and cooling medium flowing pipe 125, it is preferable that the plurality of cooling plates 126 is inserted in the cooling medium flowing pipe 125 to be fixed, and thus is attached to be detachable, instead of being fixed by welding and the like. The reason is, particularly, because it is required to adjust a flow of the gas and the adjustments can be facilitated. Accordingly, intervals of the plurality of cooling plates 126 are configured to be varied easily. In addition, for the plurality of cooling plates 126, it is shown in FIG. 16 that a plurality of rectangular plates is arranged from the gas introducing portion 122 side to the cooling medium supply mechanism 124 side, but as shown in FIG. 17, the plurality of cooing plates 126 may be arranged in parallel from the back to the front, as viewed in the figure.

Above the introducing portion 128 on the second space portion 127 side, for example, immediately above the portion 128 is disposed a heating mechanism, for example, a heater 129 to heat the cooled gas flowing from the cooling portion 123 through the introducing portion 128 to a predetermined temperature, for example, a temperature in a range between about 21° C. and about 23° C., preferably substantially 23° C. To the side of the heater 129 is disposed a blowing mechanism 130 that sends the gas of the space portion 127 to the substrate processing apparatus 1 via the ports W1 to W4. A center height position CP of a rotation mechanism of the blowing mechanism 130, for example, of a rotation fan 131 is configured to be higher than an installation position of the heater 129 to improve the efficiency in sending the wind. Further, in the second space portion 127, not shown in the figure, a humidity adjustment mechanism is provided to set the gas inside the space portion 127 at a predetermined humidity. A control mechanism 135 of the gas utility apparatus 120 is provided on the side opposite to the filter 121 of the apparatus 120, and configured to control the heater 129, cooling medium supply mechanism 124 and blowing mechanism 130 described above.

Figure 18:
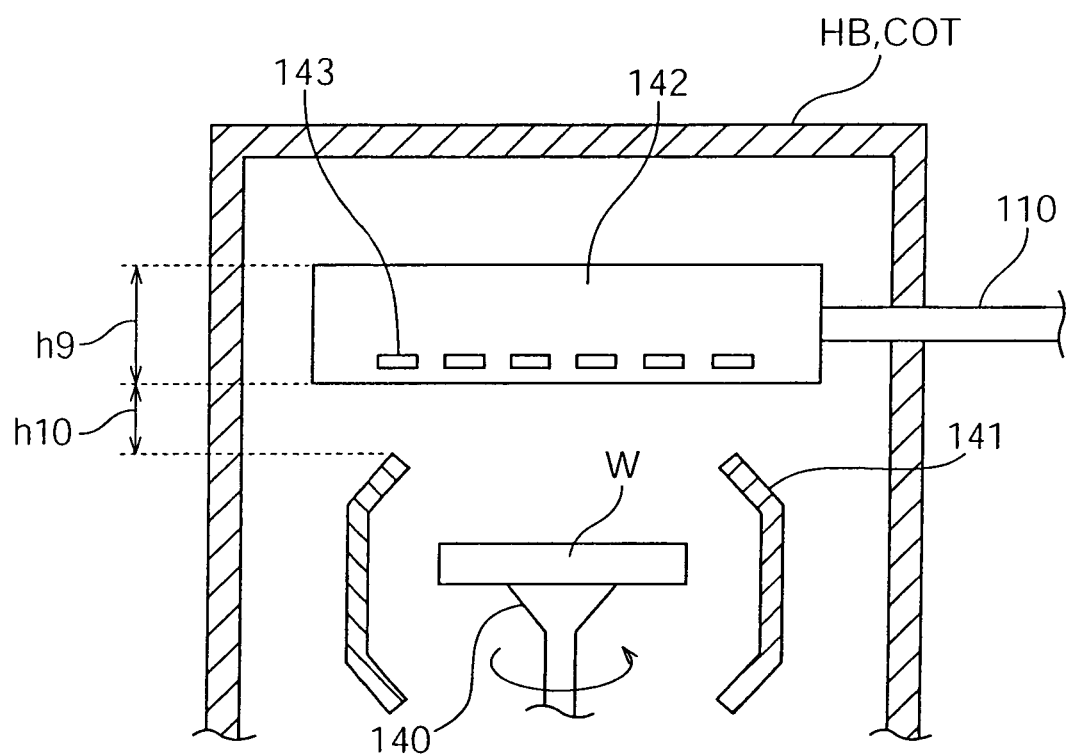
FIG. 18 is a schematic cross-sectional view to explain principal part according to the liquid processing apparatus of FIG. 15.

The gas utility apparatus 120 supplies the gas with adjusted temperature and humidity to each of the antireflective film forming apparatuses HB, coaters COT and development processing apparatuses DEV via the pipe 110, as described above. For the configuration of the antireflective film forming apparatus HB and/or coater COT, as shown in FIG. 18, the apparatus HB and/or coater COT is provided inside the apparatus with a rotation member 140 that holds the semiconductor wafer W to rotate, and a cup 141 surrounding the rotation member 140. Above the cup 141 is provided a gas supply apparatus 142 having a width H9 in the vertical direction to send the gas supplied from the pipe 110 to the direction of the cup 141. Further, the gas supply apparatus 142 has rectifying mechanisms 143 that send the down-flow with high accuracy. Furthermore, the distance between the gas supply apparatus 142 and the position of the upper face of the cup 141 is set at a distance of H10.

Figure 19:
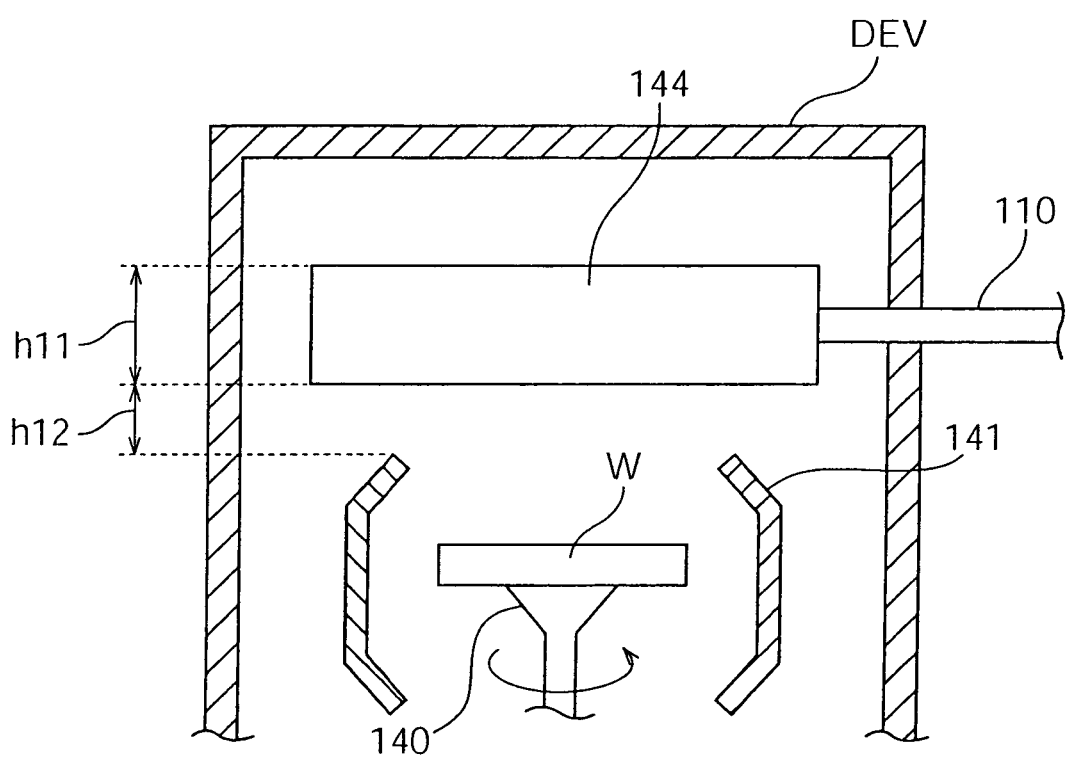
FIG. 19 is another schematic cross-sectional view to explain principal part according to the liquid processing apparatus of FIG. 15.

For the configuration of the development processing apparatus DEV, as shown in FIG. 19, the apparatus DEV is provided inside the apparatus with the rotation member 140 that holds the semiconductor wafer W to rotate, and the cup 141 surrounding the rotation member 140. Above the cup 141 is provided a gas supply apparatus 144 having a width H9 in the vertical direction to send the gas supplied from the pipe 110 to the direction of the cup 141. The gas supply apparatus may have rectifying mechanisms, but a lower degree of accuracy than that of the antireflective film forming apparatus HB and coater COT is enough, and the rectifying mechanisms are not required particularly. It is thus possible to limit the vertical length of the development processing apparatus DEV to a length smaller than the vertical length of the antireflective film forming apparatus HB and/or coater COT. Accordingly, the vertical length of the gas supply apparatus 144 is configured to be smaller than the vertical length of the gas supply apparatus 142. Further, the distance h12 between the gas supply apparatus 144 and the position of the upper face of the cup 141 is set at a distance smaller than the distance h10 described above.

Figure 20:
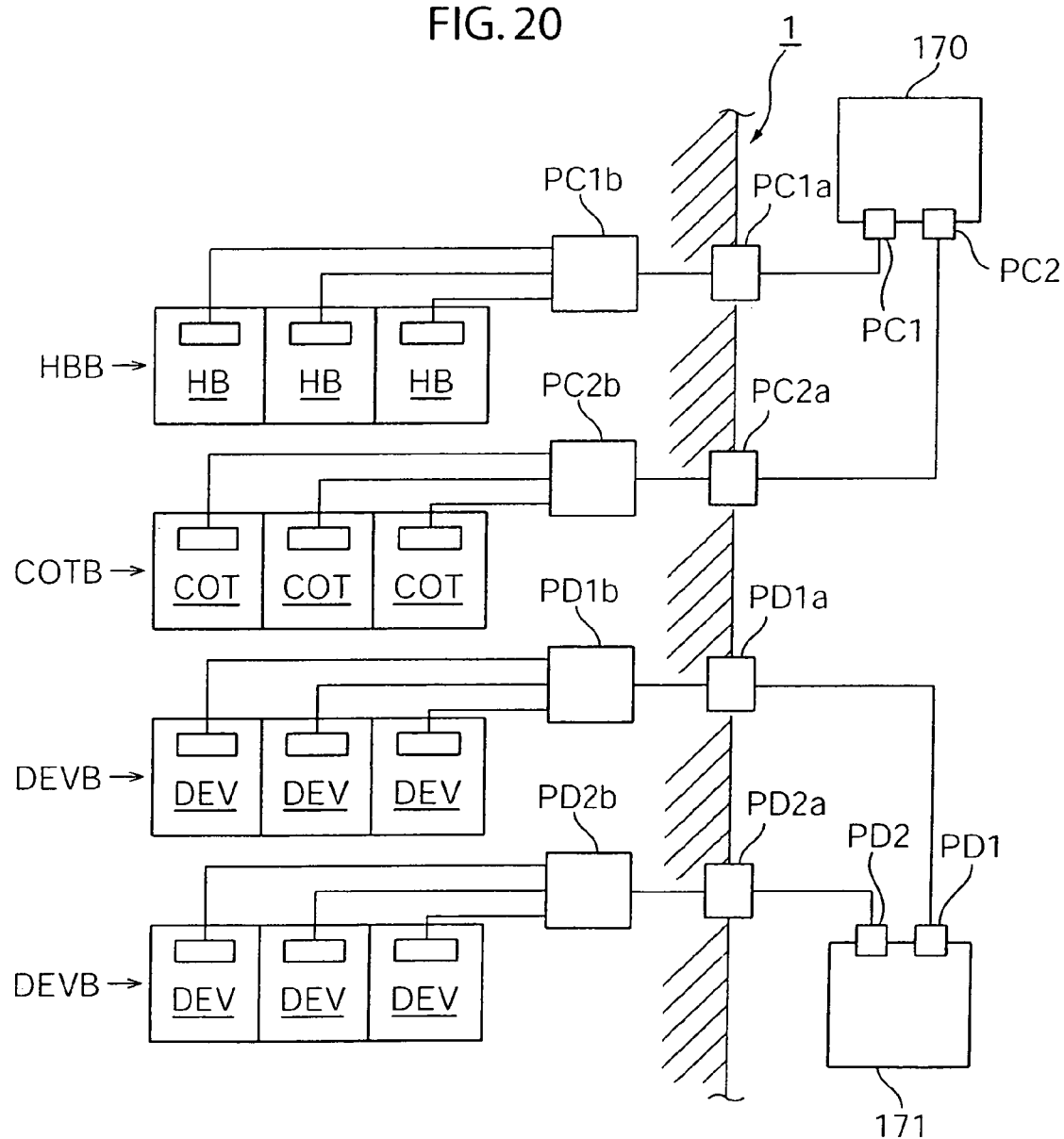
FIG. 20 is a schematic view to explain utility supply according to the liquid processing apparatus of FIG. 1.

For utility to each liquid processing apparatus of each of the horizontal blocks HBB, COTB, DEVB1 and DEVB2 of respective liquid processing apparatuses, a utility apparatus disposed outside the substrate processing apparatus 1 supplies each utility. As shown in FIG. 20, for the HBB and COTE, a utility apparatus 170 supplies a predetermined processing liquid, for example, resist solution, and an inert gas, for example, $N_2$. For the DEVBs, a utility apparatus 171 supplies a predetermined processing liquid, for example, developing solution, and pure water and the like. Described first is about the horizontal blocks HBB and COTB. The utility apparatus 170 as a COT chemical cabinet sends utility set for a predetermined temperature, for example, a processing liquid, for example, a resist solution (as the utility, the gas, for example, $N_2$ is in the same configuration, and descriptions thereof are omitted) to ports PC1a and PC2a on the substrate processing apparatus 1 side from ports PC1 and PC2, respectively. It is configured that branch mechanisms PC1b and PC2b each comprised of a valve and the like on the substrate processing apparatus 1 side are capable of supplying the utility from the ports PC1a and PC2a to each liquid processing chamber of the horizontal blocks HBB and COTB, respectively.

Described next is about the horizontal blocks HBBs. The utility apparatus 171 as a DEV chemical cabinet sends utility set for a predetermined temperature, for example, a processing liquid, for example, a developing solution (as the utility, another processing liquid, for example, pure water is in the same configuration, and descriptions thereof are omitted) to ports PD1a and PD2a on the substrate processing apparatus 1 side from ports PD1 and PD2, respectively. It is configured that branch mechanisms PD1b and PD2b each comprised of a valve and the like on the substrate processing apparatus 1 side are capable of supplying the utility from the ports PD1a and PD2a to each liquid processing chamber of the horizontal blocks DEVBs, respectively.

Figure 21:
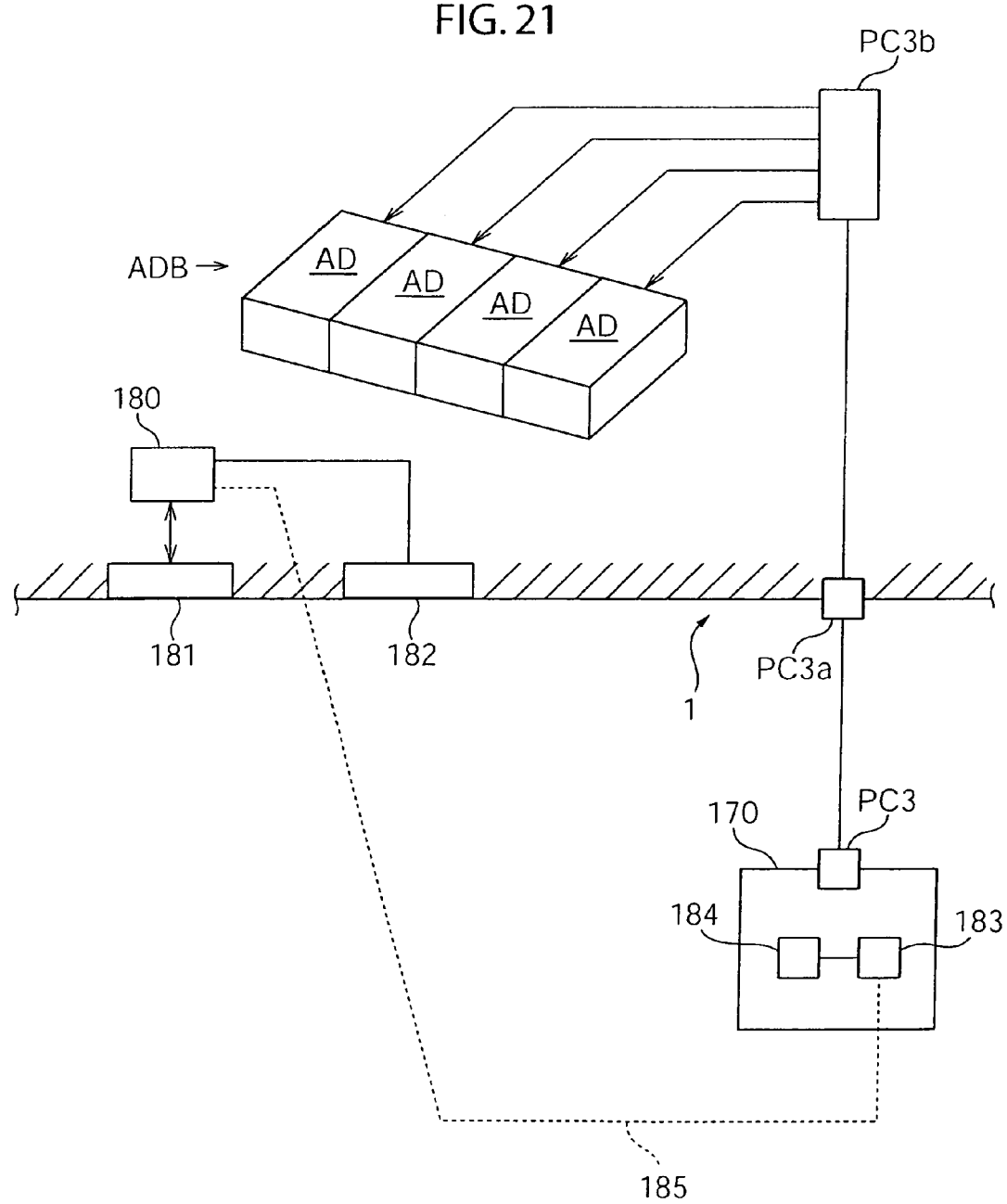
FIG. 21 is a schematic view to explain another embodiment according to utility supply of a utility apparatus of FIG. 20.

For supply of utility, for example, a predetermined processing gas, for example, a gas such as HMDS and the like, to each AD of the horizontal block ADB of ADs of the heaters, as shown in FIG. 21, the utility apparatus 170 disposed outside the substrate processing apparatus 1 as the COT chemical cabinet is configured to be shared with the above-mentioned configuration. The utility apparatus 170 sends the utility set for a predetermined temperature, for example, the gas such as HMDS and the like to a port PC3a on the substrate processing apparatus 1 side from a port PC3. A branch mechanism PC3b comprised of a valve and the like on the substrate processing apparatus 1 side is configured to be able to supply the utility from the port PC3a to each heater of the horizontal block ADB of heaters ADs. Further, the substrate processing apparatus 1 is provided with a control mechanism 180 and further with a main operation mechanism 181 and sub-operation mechanism 182. The utility apparatus 170 has a control mechanism 183 and operation mechanism 184, and the control mechanisms 183 and 180 are configured to convey information via a communication line 185 as communication means. The sub-operation mechanism 182 and operation mechanism 184 are configured to perform the same operation in predetermined operation. The same operation is operation used in performing maintenance such as dummy dispense, step control and the like. In addition, another external utility apparatus may have such an operation mechanism, but it is preferable that the substrate processing apparatus 1 and utility apparatus 170 as the COT chemical cabinet only have at least such a function.

Described next is the processing operation of the resist processing apparatus 1 configured as described above. First, a worker or cassette carrying robot places a cassette C storing a plurality of unprocessed semiconductor wafers W in a cassette mount section U1 of the cassette unit section CU. Then, the substrate carrying in/out mechanism 2 of the substrate carrying in/out mechanism section U2 carries the semiconductor wafers W out of the cassette C on a sheet basis, once adjusts the position of the semiconductor wafer W, and delivers the semiconductor wafer W to the substrate delivering/receiving section 8 of the process unit section PU.

Then, the semiconductor wafer W is carried to the substrate delivering/receiving station 20 from the substrate delivering/receiving section 8 by the substrate carrying mechanism TR1. Subsequently, the substrate delivering/receiving station 20 travels to a predetermined height position of the horizontal block HBB region in the vertical direction, and the semiconductor wafer W is carried to a predetermined AD section in the heater section by the arm 11 of the substrate carrying mechanism 10 in the horizontal block HBB region, and undergoes hydrophobic processing in the AD section. Then, the semiconductor wafer W is carried from the AD section to the heater HP in the horizontal block HBB region by the arm 11 of the substrate carrying mechanism 10 in the horizontal block HBB region, further carried to the heating processing mechanism 61 via the temperature adjustment mechanism 60 of the heater HP, and processed at a predetermined temperature. The semiconductor wafer W subjected to the heating processing in the heating processing mechanism 61 is adjusted in temperature to a predetermined temperature, for example, a temperature in a range between about 21° C. and about 23° C., preferably substantially 23° C. by the temperature adjustment mechanism 60, and carried from the heater HP by the arm 11 of the substrate carrying mechanism 10 in the horizontal block HBB region.

Further, the semiconductor wafer W is carried to a predetermined temperature adjustment section COL in the horizontal block HBB by the arm 11 of the substrate carrying mechanism 10 in the horizontal block HBB region, and adjusted in temperature to a predetermined temperature, for example, a temperature in a range between about 21° C. and about 23° C., preferably substantially 23° C. Then, the semiconductor wafer W is carried from the temperature adjustment section COL by the arm 11 of the substrate carrying mechanism 10 in the horizontal block HBB region, and moved to the direction of the liquid processing apparatus in the horizontal block HBB by the substrate carrying mechanism 10 rotating. Subsequently, the semiconductor wafer W is carried to a predetermined liquid processing apparatus HB, and an antireflective film is formed on the processing surface of the semiconductor wafer W. Then, the semiconductor wafer W is carried from the liquid processing apparatus HB by the arm 11 of the substrate carrying mechanism 10, carried to a heater HP of the heater section by the arm 11 of the substrate carrying mechanism 10 in the horizontal block HBB region, further carried to the heating processing mechanism 61 via the temperature adjustment mechanism 60 of the heater HP, and processed at a predetermined temperature.

The semiconductor wafer W subjected to the heating processing in the heating processing mechanism 61 is adjusted in temperature to a predetermined temperature, for example, a temperature in a range between about 21° C. and about 23° C., preferably substantially 23° C. by the temperature adjustment mechanism 60, and carried from the heater HP by the arm 11 of the substrate carrying mechanism 10 in the horizontal block HBB region. Further, the semiconductor wafer W is carried to a predetermined temperature adjustment section COL in the horizontal block HBB region by the arm 11 of the substrate carrying mechanism 10 in the horizontal block HBB region, and adjusted in temperature to a predetermined temperature, for example, a temperature in a range between about 21° C. and about 23° C., preferably substantially 23° C. Then, the semiconductor wafer W is carried from the temperature adjustment section COL by the arm 11 of the substrate carrying mechanism 10 in the horizontal block HBB region, and carried to the substrate delivering/receiving station 20 or 21 by the substrate carrying mechanism 10.

The substrate delivering/receiving station 20 or 21 travels to a lower position, halts in a delivering position for the arm 11 of the substrate carrying mechanism 10 in the horizontal block COT region, and delivers the semiconductor wafer W to the arm 11 of the substrate carrying mechanism 10 in the horizontal block COT region. In the horizontal block COT region, the processing steps are performed as in the processing in the HBB, but the processing steps for AD may be selected as appropriate when necessary. The semiconductor wafer with the processing in the horizontal block COT region finished is carried to the substrate delivering/receiving station and carried to the substrate delivering/receiving section 9 by the substrate carrying mechanism TR2. The semiconductor wafer W is delivered to the interface unit section IFU via the substrate delivering/receiving section 9, further delivered to the exposure apparatus 3 via the substrate carrying in/out mechanism 6 from the interface unit section IFU, and subjected to the exposure processing.

The exposure-processed semiconductor wafer W is delivered to the interface unit section IFU, and then, carried to the heating processing mechanism FH by the substrate carrying in/out mechanism 6. In the heating processing mechanism FH, the semiconductor wafer W is delivered to the temperature adjustment mechanism 60 of the heating processing mechanism FH, and undergoes heat treatment at a predetermined temperature e.g. a first temperature in the heating mechanism 61. Then, the semiconductor wafer W is delivered to the temperature adjustment mechanism 60 from the heating mechanism 61, and after the temperature of the semiconductor wafer W reaches a predetermined temperature in the temperature adjustment mechanism 60, carried to the substrate delivering/receiving section 9 by the substrate carrying in/out mechanism 6. The reason why the heating processing mechanism FH is thus disposed in the interface unit section IFU is because of controlling the time the exposure processing is performed in the exposure apparatus 3 and making the time between the exposure processing in the exposure apparatus 3 and heat treatment constant in each processing target substrate. By this means, the yield of processing target substrates is enhanced.

Then, the semiconductor wafer W is carried to the substrate delivering/receiving station 21 by the substrate carrying mechanism TR2 via the substrate delivering/receiving section 9. Subsequently, the substrate delivering/receiving station 21 travels to a predetermined height position of the horizontal block DEVB region in the vertical direction, the semiconductor wafer W is carried to a predetermined liquid processing apparatus DEV in the heater section by the arm 11 of the substrate carrying mechanism 10 in the horizontal block DEVB region, and development processing is performed on the resist film formed on the processing surface of the semiconductor wafer W. Then, the semiconductor wafer W is carried from the liquid processing apparatus DEV by the arm 11 of the substrate carrying mechanism 10, carried to the heater HP in heater section by the arm 11 of the substrate carrying mechanism 10 in the horizontal block DEVB region, further carried to the heating processing mechanism 61 via the temperature adjustment mechanism 60 of the heater HP, and processed at a predetermined temperature.

The semiconductor wafer W subjected to the heating processing in the heating processing mechanism 61 is adjusted in temperature to a predetermined temperature, for example, a temperature in a range between about 21° C. and about 23° C., preferably substantially 23° C. by the temperature adjustment mechanism 60, and carried from the heater HP by the arm 11 of the substrate carrying mechanism 10 in the horizontal block HBB region. Further, the semiconductor wafer W is carried to a predetermined temperature adjustment section COL in the horizontal block DEVB region by the arm 11 of the substrate carrying mechanism 10 in the horizontal block DEVB region, and adjusted in temperature to a predetermined temperature, for example, a temperature in a range between about 21° C. and about 23° C., preferably substantially 23° C. Then, the semiconductor wafer W is carried from the temperature adjustment section COL by the arm 11 of the substrate carrying mechanism 10 in the horizontal block DEVB region, and carried to the substrate delivering/receiving station 20 by the substrate carrying mechanism 10. Subsequently, the semiconductor wafer W is carried to the substrate delivering/receiving section 8 by the substrate carrying mechanism TR1, and via the substrate delivering/receiving section 8, carried to a predetermined cassette C by the substrate carrying in/out mechanism 2, and a series of processing is finished.

Described next is another embodiment in blocks of the antireflective film forming apparatus HB, coater COT and development processing apparatus DEV as liquid processing apparatuses of this embodiment. In addition, the same components as in the above-mentioned embodiments are assigned the same reference numerals to omit specific descriptions. Naturally, the invention according to this embodiment is capable of being used in a combination with another embodiment, and is not limited to this embodiment.

Figure 22:
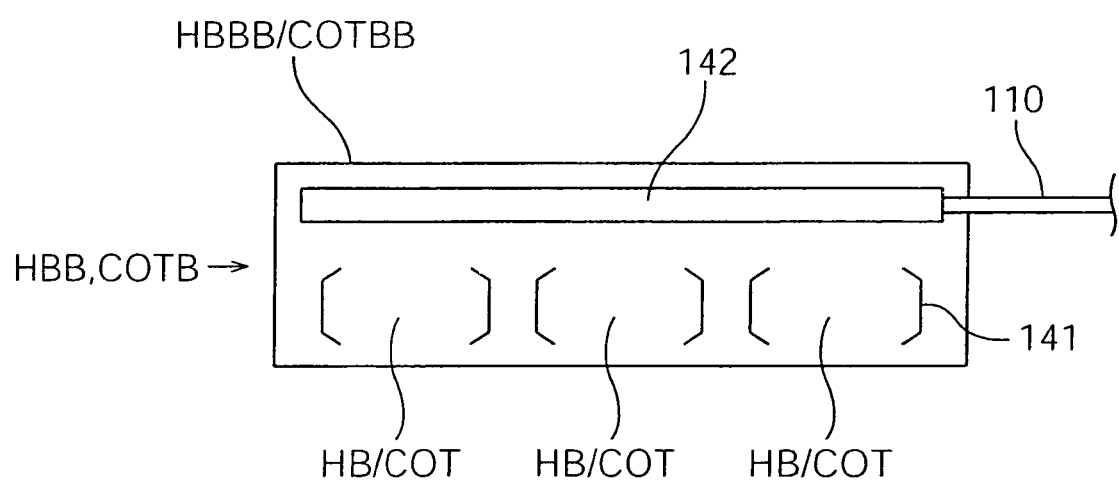
FIG. 22 is a schematic cross-sectional view to explain another embodiment according to the liquid processing apparatus.
Figure 23:
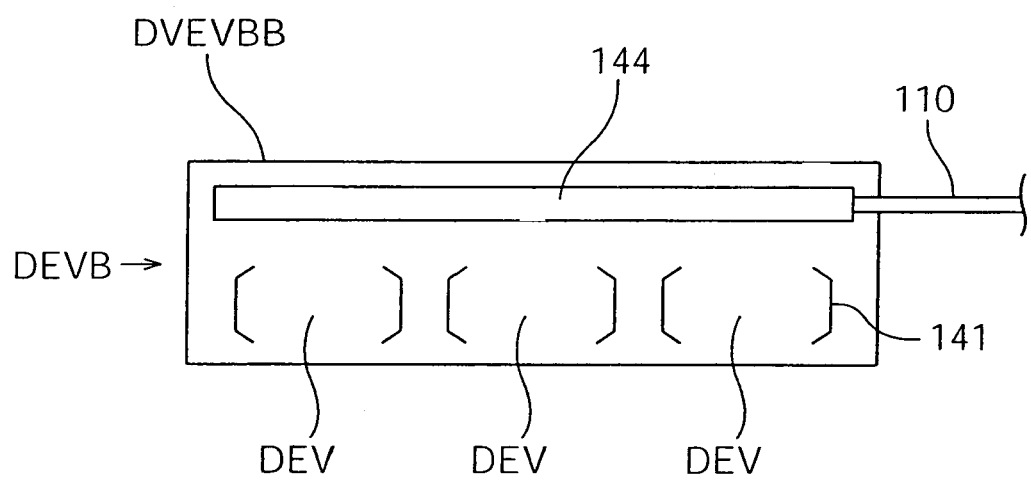
FIG. 23 is a schematic plan view to explain principal part according to the liquid processing apparatus.

Each block of the antireflective film forming apparatus HBB, coater COTB and development processing apparatus DEVB as the liquid processing apparatuses described previously is provided with respective liquid processing apparatuses, i.e. respectively with a plurality of antireflective film forming apparatuses HB, coaters COT and development processing apparatuses DEV. As shown in FIGS. 22 and 23, described herein is the antireflective film forming apparatus HBB. In the foregoing, the antireflective film forming apparatus HBB includes a plurality of antireflective film forming apparatuses HB disposed horizontally, and the atmosphere inside each antireflective film forming apparatus HB is provided independently, but the atmosphere inside each antireflective film forming apparatus HB is shared. Cups 141 are disposed in a line horizontally. A common gas supply mechanism 142 is provided in a position above the cups 141, but the gas supply mechanism 142 may be provided independently as in the foregoing. By such a configuration, distances corresponding to processing walls of liquid processing apparatuses can be eliminated, and it is thus possible to decrease the footprint as a liquid processing block, and to reduce the size of the system.

Figure 24:
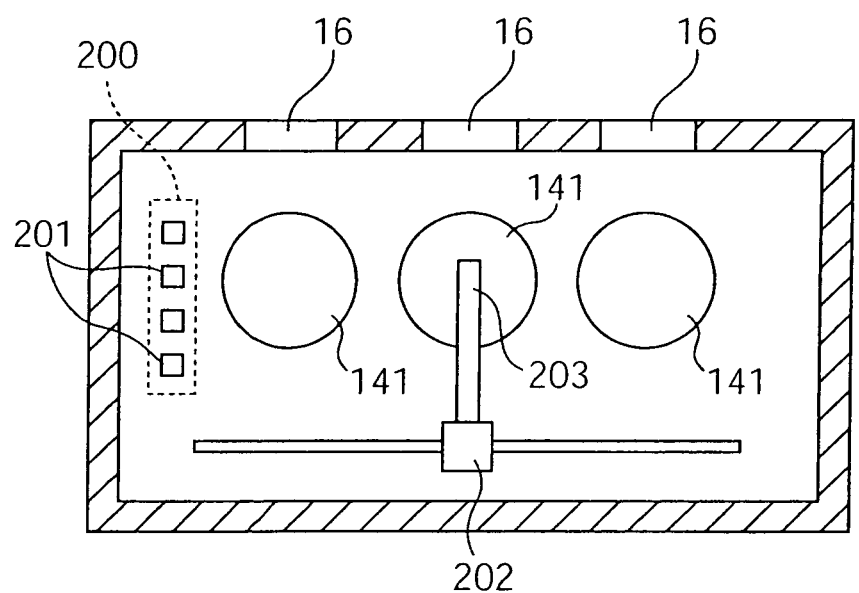
FIG. 24 is a schematic perspective view to explain another embodiment of a substrate delivering/receiving station of FIGS. 22 and 23.

Further, each block of the antireflective film forming apparatus HBB, coater COTB and development processing apparatus DEVB as the liquid processing apparatuses described previously is provided with respective liquid processing apparatuses, i.e. respectively with a plurality of antireflective film forming apparatuses HB, coaters COT and development processing apparatuses DEV, and in each liquid processing chamber are provided a nozzle that supplies the processing liquid, and a nozzle moving mechanism that moves the nozzle to above the semiconductor wafer W inside the cup. As shown in FIG. 24, when a plurality of cups 141 exists in the same space, it is configured that a single nozzle moving mechanism 202 travels in the direction parallel with the arrangement direction of the cups 141 to supply the processing liquid to the semiconductor wafer W inside each of the cups 141. Further, an arm 203 of the nozzle moving mechanism 202 is provided with a nozzle holding mechanism that holds a nozzle 201 selected as appropriate from a nozzle arrangement region 200 which is disposed in the same atmosphere inside the liquid processing apparatus and in which a plurality of nozzles 201 is linearly arranged. By such a configuration, since the need is eliminated of providing each liquid processing apparatus with the nozzle moving mechanism independently, as well as downsizing of the system, it is possible to reduce the cost of the system and improve the safety of the apparatus.

Described next is another example embodiment in blocks of the antireflective film forming apparatus HB, coater COT and development processing apparatus DEV as liquid processing apparatuses and heaters HPB, ADB and COLB of this embodiment. Naturally, the invention according to this embodiment is capable of being used in a combination with another embodiment, and is not limited to this embodiment.

Each utility apparatus as described previously supplies each utility on a horizontal block basis to the antireflective film forming apparatus HBB, coater COTE and development processing apparatus DEVB as liquid processing apparatuses as described previously and heater blocks of heaters HPB, ADB and COLB. In an apparatus where each of the antireflective film forming apparatus HBB, coater COTB and development processing apparatus DEVB, and heater blocks of heaters HPB, ADB and COLB constitutes the same type of processing apparatuses as a vertical block, instead of a horizontal block, the techniques described in example embodiments of the invention are naturally applied on a vertical block basis, instead of a horizontal block basis. Further, the invention is also applicable to the case where a plurality of block is configured in the form of a rectangle, for example, as four blocks.

Described next is another example embodiment in the gas utility apparatus 120 of this embodiment. In addition, the same components as in the above-mentioned embodiments are assigned the same reference numerals to omit specific descriptions. Naturally, the invention according to this embodiment is capable of being used in a combination with another embodiment, and is not limited to this embodiment.

Figure 25:
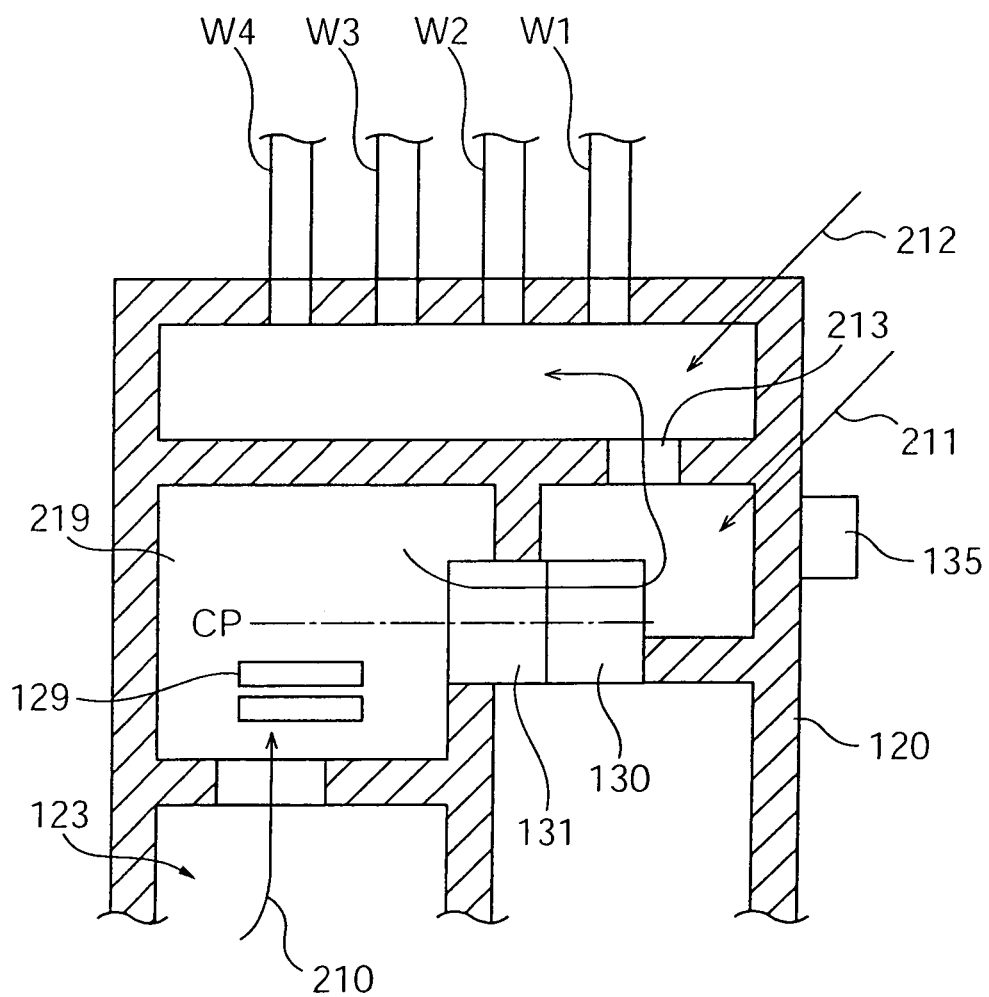
FIG. 25 is a schematic cross-sectional view to explain another embodiment of the utility apparatus of FIG. 16.

As another example embodiment of the gas utility apparatus 120 in the foregoing, as shown in FIG. 25, the gas from the first space portion 123 is introduced to the second space portion 219 via the introducing portion 128 as a path (flowing portion) to introduce the gas cooled by the cooling plates 126, and heated to a predetermined temperature in the second space portion 219 by the heater 129 that is the same as in the foregoing. Then, it is configured that the gas is introduced to a third space portion 211 on the operation mechanism side of the control mechanism 135 by a fan as the rotation fan 131. It is further configured that the gas is adjusted in the third space portion 211 by a humidity adjustment mechanism not shown that adjusts the gas to a predetermined humidity, and introduced to a fourth space portion 212 via an opening portion 213. Thus, provided are the first space portion 123 as a gas cooling section, the second space portion 219 as a gas heating section, the third space portion 211 as a gas humidifying section and the fourth space portion 212 as a section to exhaust the gas to another apparatus, and it is thereby possible to efficiently control the temperature, humidity and total exhaust amount. Further, since the second space portion 219 and third space portion 211 are disposed in substantially horizontal positions, it is possible to achieve a reduction in size of the apparatus itself. The gas exhausted from the fourth space portion 212 may be used as the down-flow in the interface unit section IFU of the resist processing apparatus 1.

The semiconductor wafer is used as the above-mentioned substrate and described, but the invention is not limited thereto. For example, a glass substrate such as an LCD substrate and the like may be used, and further, substrates of disks such as CD and the like may be used. The liquid processing is not limited to development and coating, and the invention is applicable to a cleaning apparatus and the like, and is not limited particularly in methods and apparatuses using the processing liquid. Further, the technique of the invention is applicable to apparatuses where one liquid processing apparatus is replaced with an inspection apparatus and the like.

According to conventional substrate processing apparatus, the process unit section PU of the substrate processing apparatus includes a lot of units such as heat treatment apparatuses HP (for example, hot plate), temperature adjustment apparatuses COL (for example, cool plate), hydrophobic processing apparatuses AD (for example, adhesion plate), antireflective film forming apparatuses HB, coaters COT, development processing apparatuses DEV.

According as the number of the antireflective film forming apparatuses HB, coaters COT and development processing apparatuses DEV loaded in the substrate processing apparatus increases so as to increase throughput of the substrate processing apparatus such as a photolithography processing apparatus through parallel processing, it is required to increase the number of temperature adjustment apparatuses COL provided in the substrate processing apparatus. Namely, a lot of temperature adjustment apparatuses COL needs to be loaded in the substrate processing apparatus so as to increase the throughput of the substrate processing apparatus considering wafer flow. In case a lot of temperature adjustment apparatuses COL are provided in the substrate processing apparatus for the purpose of increasing the throughput of the substrate processing apparatus (i.e. increasing the yield according to the processing of target processing substrates), the size and complexity of the substrate processing apparatus increase too much, and the throughput in the FAB decreases, and thus the temperature adjustment apparatuses COL is provided inside the heat treatment apparatus HP.

Recently, when film-forming chemical (i.e. photo resist) on a wafer is exposed by an exposure and is heated by Oven (for example, heat treatment apparatuses HP), a chemical reaction is amplified to form a pattern with a constant line-width at the portion into which light is applied. In this case, unless the wafer amplified through a PEB (Post exposure bake) processing at the Oven is cooled within about three seconds or about five seconds and the temperature of the wafer decreases to a temperature in a range between about 21° C. and about 23° C., preferably about 23° C. within a short time such as 30 seconds, a pattern is exposed more widely to have a line-width wider than desired line-width, and thus desired line-width cannot be obtained.

In case of a conventional substrate processing apparatus in which the temperature adjustment apparatus COL is provided inside the heat treatment apparatus HP, a lot of temperature adjustment apparatuses COL can be loaded into substrate processing apparatus to increase the throughput of the substrate processing apparatus. However, unless the temperature of the wafer amplified through a PEB (Post exposure bake) processing at the Oven decreases to a temperature in a range between about 21° C. and about 23° C., preferably about 23° C. within a short time such as 30 seconds, a pattern is exposed more widely to have a line-width wider than desired line-width, and thus desired line-width cannot be obtained. Further, when means for controlling the temperature of said a lot of temperature adjustment apparatuses COL are (or is) provided inside the substrate processing apparatus in which the temperature adjustment apparatus COL is provided inside the heat treatment apparatus HP, the size and complexity of the substrate processing apparatus increase. Further, in case the substrate processing apparatus includes a lot of temperature adjustment apparatuses COL each of which is provided inside the heat treatment apparatus HP, the total throughput of the substrate processing apparatus decreases when there is deviation in the temperatures of said a lot of temperature adjustment apparatuses COL, and thus the temperature of the temperature adjustment apparatuses COL needs to be controlled so as to prevent the deviation in the temperatures of said a lot of temperature adjustment apparatuses COL, especially, in case of the variation of the processing environments (or conditions) such as atmosphere.

According to example embodiments of present invention, 1) in order to control the temperature of said a lot of temperature adjustment apparatuses COL provided inside the substrate processing apparatus in which the temperature adjustment apparatus COL is provided inside the heat treatment apparatus HP, a single utility apparatus which is disposed outside the substrate processing apparatus provides temperature adjustment liquid, of which temperature is predetermined by the single utility apparatus, to the temperature adjustment apparatuses COL of the heat treatment apparatuses HP, thereby reducing the complexity and/or size of the substrate processing apparatus, and 2) the temperature adjustment liquid, of which temperature is predetermined by the single utility apparatus, is supplied to the temperature adjustment apparatuses COL of the heat treatment apparatuses HP for each vertical block, for each horizontal block, to a predetermined number of the heat treatment apparatuses HP in the vertical block, or of predetermined number of the heat treatment apparatuses HP in the horizontal block, thereby reducing in the temperature of said a lot of temperature adjustment apparatuses COL provided inside the heat treatment apparatuses HP for each block.

According to example embodiments of present invention, referring to FIG. 3 and FIG. 9, each of the heaters (i.e. heat treatment apparatus) HP1 to HP4 of the heater blocks (i.e. heat treatment apparatus blocks) HPB1 to HPB4 is provided with a temperature adjustment mechanism 70 and a heating mechanism 71, and, referring to FIG. 10, FIG. 11, FIG. 12 and FIG. 13, a utility apparatus 100 disposed outside the substrate processing apparatus supplies cooling liquid (i.e. the temperature adjustment liquid) having the predetermined temperature through a cooling medium supply mechanism 81 (i.e. a supply port) of ports 90, 91, 92 and 93 to temperature adjustment mechanisms 70 and collect the cooling liquid through a cooling medium recovery mechanism 83 of ports 90, 91, 92 and 93 from the temperature adjustment mechanisms 70, and thereby effectively increasing the number of temperature adjustment apparatuses COL to increase throughput of the substrate processing apparatus through parallel processing without deviation in the temperature of each temperature adjustment apparatuses COL and reducing the complexity of the substrate processing apparatus.

According to example embodiments of present invention, referring to FIG. 15, a gas utility apparatus 120 disposed outside the substrate processing apparatus supplies the gas with adjusted predetermined temperature and humidity through ports WPFP1 to WPFP4 provided in predetermined positions of the substrate processing apparatus to horizontal liquid processing apparatus blocks such as HBB, COTB, DEVB1 and DEVB2, and thereby effectively increasing throughput of the substrate processing apparatus through parallel processing while reducing the deviation in the temperature and humidity of each liquid processing apparatus block such as HBB, COTB, DEVB1 and DEVB2 and reducing the complexity of the substrate processing apparatus.

The example embodiments of present invention mainly constitutes a substrate processing apparatus which is provided with a plurality of heat treatment apparatus blocks each comprised of a plurality of stacked heat treatment apparatuses each having a temperature adjustment mechanism configured to be able to move a processing target substrate to a heating mechanism and adjust the temperature of the processing target substrate, and which has a cooling liquid supply mechanism that supplies a cooling liquid set for a predetermined temperature to be supplied for each of the heat treatment apparatus blocks, and a branch mechanism which branches the cooling liquid supplied from the cooling liquid supply mechanism and supplies the cooling liquid to a plurality of heating mechanisms in one of the heat treatment apparatus blocks, and thereby exerts the effects of facilitating control of the system of a plurality of heaters (i.e. heat treatment apparatus) and the like, reducing the number and/or the size of pipes and the like in utility, improving throughput in the processing according to maintenance and the like, facilitating control of processing time of each processing apparatus, and thus improving the yield according to the processing of target processing substrates.

The present invention is applicable to a substrate processing apparatus, substrate processing method, utility supply apparatus of the substrate processing apparatus and utility supply method of the substrate processing apparatus.

What is claimed is:

1. A substrate processing apparatus comprising: a plurality of blocks of heat treatment apparatus groups each comprised of heat treatment apparatuses each of which treats a processing target substrate at a predetermined temperature and which are stacked in a vertical direction as a vertical block, or which are disposed in a horizontal direction as a horizontal block;

a temperature adjustment mechanism that is provided in each of the heat treatment apparatuses and that adjusts a temperature of the processing target substrate;

a heating mechanism that is provided in each of the heat treatment apparatuses and that performs heating processing on the processing target substrate;

a plurality of supply ports that supplies a temperature adjustment liquid having a predetermined temperature, which is predetermined for the purpose of adjusting a temperature of the processing target substrate to substantially the predetermined temperature, to the temperature adjustment mechanisms of the heat treatment apparatuses for each vertical block, each horizontal block, predetermined number of the heat treatment apparatuses in the vertical block, or predetermined number of the heat treatment apparatuses in the horizontal block; and a plurality of recovery ports that collects the liquid supplied to the temperature adjustment mechanisms of the heat treatment apparatuses for each vertical block, each horizontal block, predetermined number of the heat treatment apparatuses in the vertical block, or predetermined number of the heat treatment apparatuses in the horizontal block, wherein the heat treatment apparatus groups include a heat treatment apparatus that does not adjust the temperature of the processing target substrate adjusted by the temperature adjustment mechanism and that supplies a predetermined processing gas to the processing target substrate to perform heating processing and a heat treatment apparatus that adjusts the temperature of the processing target substrate.

2. The substrate processing apparatus according to claim 1, after the heating mechanism performs a PEB (Post Exposure Bake) processing on the processing target substrate, wherein the temperature adjustment mechanism that is provided in each of the heat treatment apparatuses adjusts a temperature of the processing target substrate to the predetermined temperature using the temperature adjustment liquid having the predetermined temperature.

3. The substrate processing apparatus according to claim 1, wherein the temperature of the processing target substrate subjected to the heating processing in the heating mechanism is adjusted to the predetermined temperature, in a range between about 21.degree. C. and about 23.degree. C., by the temperature adjustment mechanism.

4. The substrate processing apparatus according to claim 1, further comprising a plurality of liquid processing apparatus blocks stacked or disposed in the horizontal direction, each of the blocks comprised of a plurality of liquid processing apparatuses each of which supplies a predetermined processing liquid to the processing target substrate to perform the same processing and which is disposed in the horizontal direction or the vertical direction, or a liquid processing apparatus block comprised of a plurality of liquid processing apparatuses which is stacked in the vertical direction and each of which has a plurality of processing cups each supplying a predetermined processing liquid to the processing target substrate to perform processing, or a plurality of carrying mechanisms stacked between the heat treatment apparatus groups and the liquid processing apparatus block.

5. The substrate processing apparatus according to claim 4, wherein a single utility apparatus introduces utility for supplying the predetermined processing gas to the heat treatment apparatus that does not adjust the temperature of the processing target substrate moved by the moving mechanism and that performs heating processing on the processing target substrate and for supplying the predetermined processing liquid to the liquid processing apparatuses each of which supplies the predetermined processing liquid to the processing target apparatus to perform processing, wherein the single utility apparatus is disposed outside the substrate processing apparatus.

6. The substrate processing apparatus according to claim 1, further comprising a plurality of liquid processing apparatus blocks stacked or disposed in the vertical direction, each of the liquid processing apparatus blocks comprised of a plurality of liquid processing apparatuses stacked or disposed in the horizontal direction.

7. The substrate processing apparatus according to claim 6, wherein the plurality of blocks of heat treatment apparatus groups each comprised of heat treatment apparatuses are stacked in the vertical direction as a vertical heat treatment apparatus block, each of the vertical heat treatment apparatus block includes a plurality of horizontal heat treatment apparatus blocks each comprised of heat treatment apparatuses stacked in the horizontal direction, and the vertical heat treatment apparatus block has the same vertical length as that of one of the liquid processing apparatus blocks.

8. The substrate processing apparatus according to claim 7, further comprising a plurality of stacked substrate carrying mechanisms, a travel region in the vertical direction of the substrate carrying mechanism corresponding to the vertical heat treatment apparatus block is configured to correspond to one of the liquid processing apparatus blocks corresponding to the vertical heat treatment apparatus block, have the same vertical length of one of the liquid processing apparatus blocks corresponding to the vertical heat treatment apparatus block, and enable the substrate carrying mechanism to carry the processing target substrate to the vertical heat treatment apparatus block and said one of the liquid processing apparatus blocks corresponding to the vertical heat treatment apparatus block.

9. The substrate processing apparatus according to claim 1, wherein the plurality of supply ports that supplies the liquid and the plurality of recovery ports that collects the liquid are connected to a single utility apparatus which is disposed outside the substrate processing apparatus, and wherein the temperature of the temperature adjustment liquid is set to the predetermined temperature by the single utility apparatus, the liquid supplied by the supply ports is supplied by the single utility apparatus and the liquid collected by the recovery ports is recovered by the single utility apparatus.

10. The substrate processing apparatus according to claim 1, further comprising a moving mechanism that moves the temperature adjustment mechanism forward or backward with respect to the heating mechanism.

11. A substrate processing method for a substrate processing apparatus provided with a plurality of heat treatment apparatus blocks each comprised of a plurality of stacked heat treatment apparatuses each having a temperature adjustment mechanism and a heating mechanism, the temperature adjustment mechanism adjusting a temperature of a processing target substrate, and with a plurality of liquid processing apparatus blocks each comprised of a plurality of liquid processing apparatuses each of which supplies a predetermined processing liquid to the processing target substrate to perform a same processing and which is disposed in a horizontal direction or a vertical direction, or with a liquid processing apparatus block comprised of a plurality of liquid processing apparatuses which is disposed in a vertical direction and each of which has a plurality of processing cups each supplying a predetermined processing liquid to the processing target substrate to perform processing, comprising:

supplying a cooling liquid set for a predetermined temperature supplied for each of the heat treatment apparatus blocks or a plurality of heat treatment apparatuses in the heat treatment apparatus blocks; and supplying a gas set for a predetermined temperature and a predetermined humidity supplied for each of the heat treatment apparatus blocks or each liquid processing apparatus, and wherein the cooling liquid is set for the predetermined temperature for the purpose of adjusting a temperature of the processing target substrate to substantially the predetermined temperature by a single utility apparatus which is disposed outside the substrate processing apparatus.

12. The substrate processing method according to claim 11, further comprising:

branching the supplied cooling liquid and supplying the cooling liquid to each temperature adjustment mechanism of the heating mechanisms in one of the heat treatment apparatus blocks.

13. The substrate processing method according to claim 12, wherein the gas is set for the predetermined temperature and the predetermined humidity by the single utility apparatus, and the cooling liquid is set for the temperature substantially the same as the temperature of the gas adjusted in the temperature and the humidity supplied to the liquid processing apparatuses.

14. The substrate processing method according to claim 12, wherein the step of supplying the cooling liquid and the step of recovering the cooling liquid are performed by the single utility apparatus to perform supply and recovery of the cooling liquid substantially at the same time.

15. The substrate processing method according to claim 11, further comprising:

recovering the cooling liquid supplied for each of the heat treatment apparatus blocks or the plurality of heat treatment apparatuses in the heat treatment apparatus blocks.

16. The substrate processing method according to claim 15, further comprising:

receiving temperature information of the cooling liquid recovered for each of the heat treatment apparatus blocks or the plurality of heat treatment apparatuses in the heat treatment apparatus blocks, by communication with the single utility apparatus which is disposed outside the substrate processing apparatus.

17. The substrate processing method according to claim 15, wherein when the temperature of the cooling liquid recovered for each of the heat treatment apparatus blocks or the plurality of heat treatment apparatuses in the heat treatment apparatus blocks is higher than the predetermined temperature, the cooling liquid set for the predetermined temperature for each of the heat treatment apparatus blocks or the plurality of heat treatment apparatuses in the heat treatment apparatus blocks is supplied from another supply line.

* * * * *